(12) United States Patent
Ding et al.

(10) Patent No.: US 6,929,974 B2
(45) Date of Patent: Aug. 16, 2005

(54) FEEDTHROUGH DESIGN AND METHOD FOR A HERMETICALLY SEALED MICRODEVICE

(75) Inventors: Xiaoyi Ding, Lake Zurich, IL (US); Jeffrey J. Frye, Grayslake, IL (US)

(73) Assignee: Motorola, Inc., Schaumburg, IL (US)

( * ) Notice: Subject to any disclaimer, the term of this patent is extended or adjusted under 35 U.S.C. 154(b) by 337 days.

(21) Appl. No.: 10/347,671

(22) Filed: Jan. 21, 2003

(65) Prior Publication Data

US 2004/0077117 A1 Apr. 22, 2004

Related U.S. Application Data

(60) Provisional application No. 60/419,514, filed on Oct. 18, 2002.

(51) Int. Cl.$^7$ .......................... H01L 21/44; H01L 21/48; H01L 21/50; H01L 23/552
(52) U.S. Cl. ....................... 438/106; 438/108; 438/111; 438/113; 438/125; 438/109; 257/659; 257/660; 257/704; 257/682
(58) Field of Search ................................ 438/106, 108, 438/111, 113, 125, 109; 257/659, 660, 704, 682

(56) References Cited

U.S. PATENT DOCUMENTS

| | | | | |
|---|---|---|---|---|
| 4,541,003 A | * | 9/1985 | Otsuka et al. ............... | 257/660 |
| 4,630,095 A | * | 12/1986 | Otsuka et al. ............... | 257/660 |
| 4,769,345 A | * | 9/1988 | Butt et al. .................... | 29/827 |
| 4,771,214 A | | 9/1988 | Takenaka et al. | |
| 5,610,431 A | | 3/1997 | Martin | |
| 5,614,785 A | | 3/1997 | Wallace et al. | |
| 5,650,568 A | | 7/1997 | Greiff et al. | |
| 5,837,562 A | * | 11/1998 | Cho ............................. | 438/51 |
| 6,225,145 B1 | | 5/2001 | Choi et al. | |
| 6,277,666 B1 | | 8/2001 | Hays et al. | |
| 6,323,550 B1 | | 11/2001 | Martin et al. | |
| 6,338,284 B1 | | 1/2002 | Najafi et al. | |
| 6,806,557 B2 | * | 10/2004 | Ding .......................... | 257/659 |

FOREIGN PATENT DOCUMENTS

EP 0 851 492 A2 7/1998

OTHER PUBLICATIONS

Anderson, R. et al. "Investigation of Porous Silicon Vapor Sensing" *Sensors and Actuators*; A21–A23– 1990, pp, 835–839.

(Continued)

*Primary Examiner*—Matthew Smith
*Assistant Examiner*—Igwe U. Anya
(74) *Attorney, Agent, or Firm*—Brian Mancini; Thomas V. Miller

(57) ABSTRACT

A microdevice (20, 120, 220) having a hermetically sealed cavity (22, 122, 222) to house a microstructure (26, 126, 226). In one embodiment, the microdevice (20) comprises a substrate (30), a cap (50) and an isolation layer (70). The substrate (30) has a plurality of conductive traces (38) formed on at least a portion of its top side (32) and outer edge (36). The conductive traces (38) provide electrical conductivity to the microstructure (26). The isolation layer (70) is attached between an outer edge of a sidewall (54) of the cap (50) and the plurality of conductive traces (38). The cavity (22) is at least partially defined by a recess (56) in the cap (50). There is also a microdevice (120) comprising a substrate (130), a cap (150) and a plurality of via covers (170). The substrate (130) has conductive vias (196) that terminate at a contact point (146) within the sealed cavity (122). The via covers (170) are attached to the substrate (130) to provide a hermetic seal. There is a further microdevice (220) comprising a substrate (230), a cap (250), and a plurality of conductive members (270). The cap (250) has conductive vias (296) that terminate at the conductive members (270). The conductive members (270) are electrically connected to the microstructure (226). There are also methods of forming the microdevice (20, 120, 220).

36 Claims, 13 Drawing Sheets

OTHER PUBLICATIONS

Dresser, M.J. et al. "The Absorption and Decomposition of $NH_3$ on Si(100) Detection of the $NH_2$(a) Species." *Surface Science*; 1989, pp. 75–89.

Dillon, A.C. et al. "Diethylsilane Decomposition on Silicon Surfaces Studied Using Transmission FTIR Spectroscopy." *J.Electrochemical Society*; vol. 139, No. 2, Feb. 1992, pp. 537–541.

Robinson, M.B. et al. "Porous Silicon Photoluminescence Versus HF Etching: No Correlation with Surface Hydrogen Species." *American Institute of Physics*; Mar. 1993, pp, 1493–1495.

Collins, R.T. et al. "Photoinduced Hydrogen Loss From Porous Silicon." *American Institute of Physics*; Oct. 1992, pp, 1649–11651.

Takahagi, T.et al. "Control of the Chemical Reactivity of a Silicon Single–Crystal Surface Using the Chemical Modification Technique." *American Institute of Physics*; Sep. 1990, pp, 2187–2191.

Cheng, C.C. et al. "Direct Determination of Absolute Monoslayer Coverages of Chemisorbed $C_2H_2$ and $C_2H_4$ on Si(100)." *American Institute of Physics*; Apr. 1992, pp. 3693–3699.

Corazza, A. et al. "Vacuum Maintenance in Hermetically Sealed MEMs Packages." *SAES Getters*.

Smith, R.L. et al. "Thick Films of Silicon Nitiride." *Sensors and Actuators*; A21–A23, 1990, pp. 830–834.

Petersen, K. "Silicon as a Mechanical Material." *Proceedings of the IEEE*; vol. 70, No. 5, May 1982, pp. 420–456.

Kozlowski, F. et al. "Generating a Microplasma with Porous Silicon." *Transducers*; 1995, 90–PB4.

Smith, R.L. et al. "Porous Silicon Morphologies and Formation Mechanism." *Sensors and Actuators*; A21–A23, 1990, pp. 825–829.

Smith, R.L. et al. "Porous Silicon Formation Mechanisms." *American Institute of Physics*; Apr. 1992, pp. R1–R22.

Giorgi, T.A., "An Updated Review of Getters and Gettering." *Journal of Vacuum Science Technology*; A3 (2) Mar./Apr. 1995. pp. 417–423.

Kullberg, R. "Processes and Materials for Creating and Maintaining Reliable Vacuum and Other Controlled Atmospheres in Hermetically Sealed MEMs Packages." *SAES Getters*.

Henkel, S. "Novel Gas Sensor Exploits a Property of Porous Silicon." www.sensormag.com, May 2002.

Higashi, G.S. et al. "Comparison of Si(111) Surfaces Prepared Using Aqueous Solutions of $NH_4F$ Versus HF." *American Institute of Physics*; Apr. 1991, pp. 1656–1658.

Hirashita, N. et al. "Effects of Surface Hydrogen on the Air Oxidation at Room Temperature of HF–treated Si(100) Surfaces." *American Institute of Physics*; Jan. 1990 pp. 451–453.

Higashi, G.S. et al. "Ideal Hydrogen Termination of Si(111) Surface." *American Institute of Physics*; Feb. 1990, pp. 656–658.

Gupta, P. "FTIR Studies of $H_2O$ and $D_2O$ decomposition on Porous Silicon Surfaces." *Surface Science* ; 1991, pp. 360–372.

O'Halloran, G.M. et al. "A Bulk Micromachined Humidity Sensor Based on Poruos Silicon." *Transducers* 1997, pp 563–566.

Richter, A. "Design Considerations and Performance of Adsorptive Humidity Sensors with Capacitive Readout." *Transducers*; 1993, pp. 310–313.

\* cited by examiner

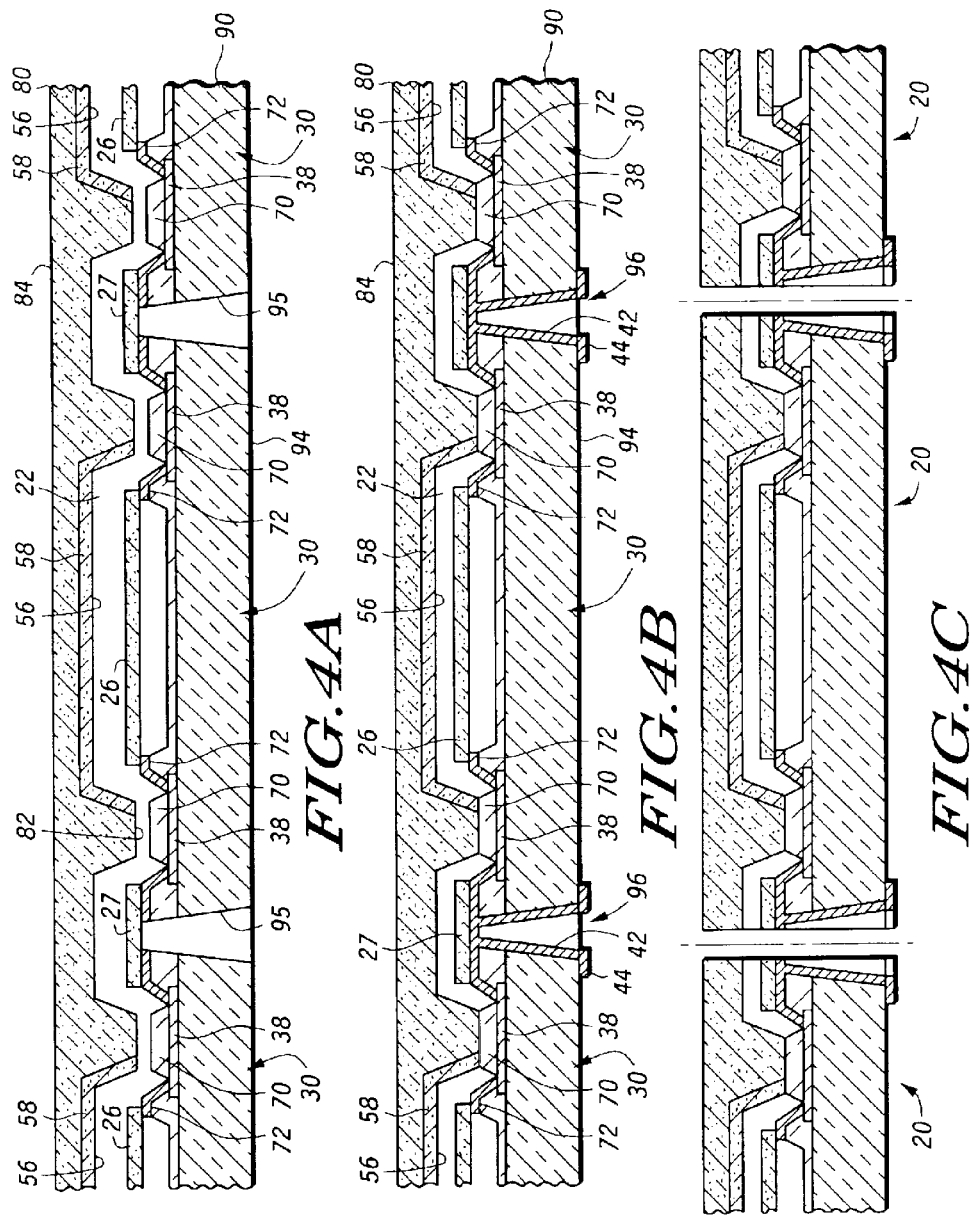

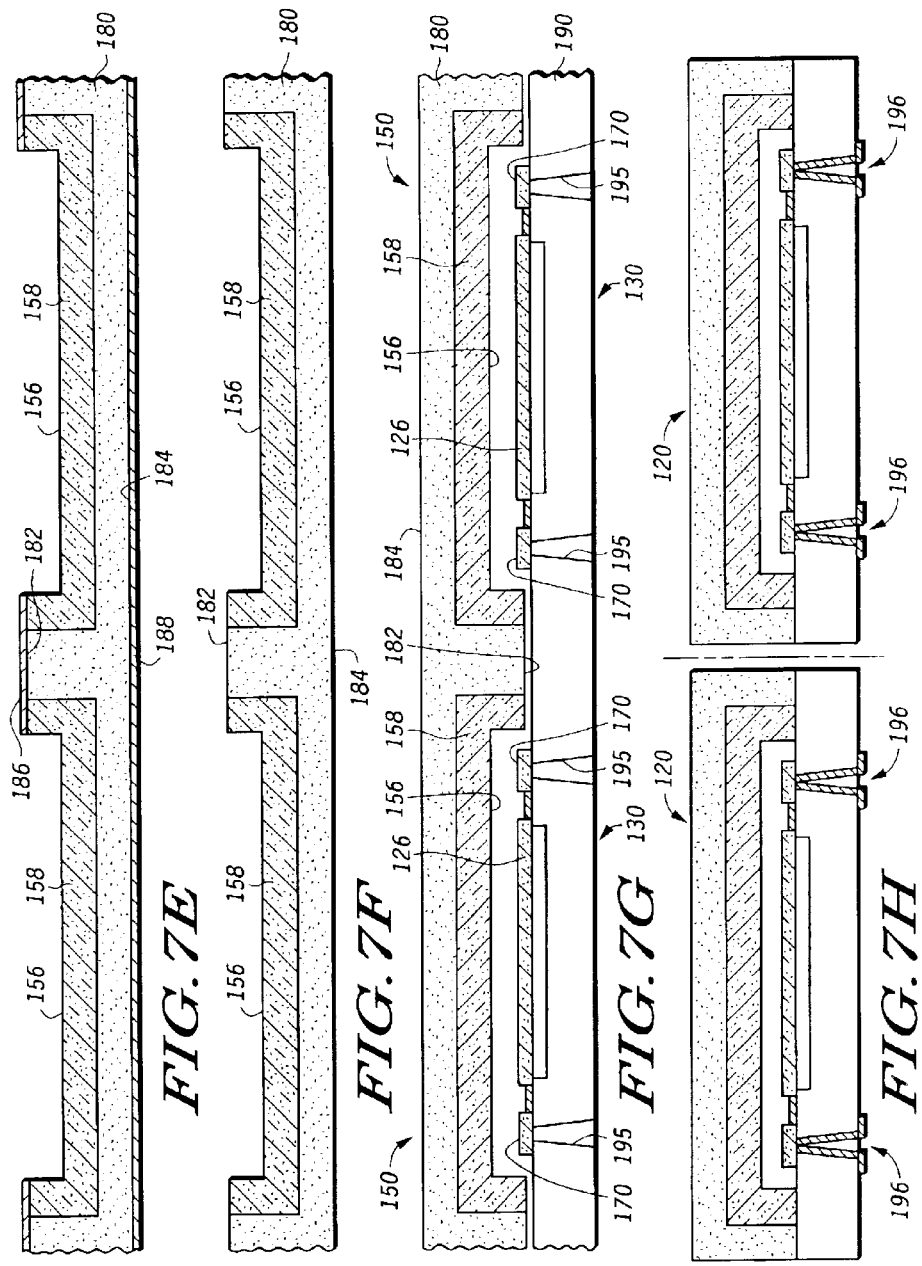

FEEDTHROUGH DESIGN AND METHOD FOR A HERMETICALLY SEALED MICRODEVICE

The present application claims priority from provisional application Ser. No. 60/419,514, entitled "Feedthrough Design and Method for a Hermetically Sealed Microdevice," filed Oct. 18, 2002, which is commonly owned and incorporated herein by reference in its entirety.

FIELD OF THE INVENTION

This invention in general relates to microdevices having a microstructure that is housed within a vacuum cavity of the microdevice and, more particularly, to a conductive feedthrough design and method for electrically connecting the microstructure to the outside environment.

BACKGROUND OF THE INVENTION

The microdevices manufactured by MEMS technology are playing key roles in many areas. For instance, micromechanical gyroscopes have enabled several important control systems in transportation and commercial applications. Other microdevices such as pressure sensors, accelerometers, actuators and resonators fabricated by MEMS technology are also used in many areas.

Some microdevices, such as micro gyroscopes and resonators contain a microstructure that needs to be maintained within a vacuum-sealed cavity. For these types of devices, there is a continuing need to improve the methods and techniques to hermetically seal the cavity to increase device lifetime. Pressure increases due to several sources can degrade device performance and reduce device lifetime for hermetically sealed microdevices.

One source that may cause pressure to increase in the cavity of a microdevice is inadequate sealing methods and techniques. For example, a microstructure has electrodes that need to be electrically connected to the outside environment in an appropriate way to meet further level packaging requirements, for instance, a surface mount capability. A suitable feedthrough design and hermetic seal method around the feedthroughs are needed to ensure a complete electrical connection and an appropriate cavity vacuum level over a device's lifetime.

For the wafer level hermetical seal, it has been known to electrically connect the electrodes of a microstructure through certain types of conductive vias formed in a wafer. This approach, however, has several disadvantages. For example, the formation of conductive vias in a wafer may result in mechanical damage to the microstructure mounted on the wafer. Additionally, vacuum degradation may occur over time due to micro cracks or other defects in the conductive via. This is especially true if the conductive via extends into the vacuum-sealed cavity that houses the microstructure. Moreover, the size of the microdevice increases with the number of vias required for connecting to the microstructure.

Another source of pressure increase in the cavity of a microdevice is from gas generation during the hermetic sealing process and outgassing from the package material, sealing material, and components within the cavity. With respect to outgassing problems, it has been known to maintain a sealed vacuum within a cavity by using getters to adsorb vapor and gas species. Two different kinds of getters currently used in devices are metallic getters and non-metallic getters. It has been known to use the metallic getters in package level vacuum sealing methods. A non-metallic getter formed from organic salts of silicon for an electron tube application is described in U.S. Pat. No. 4,771,214. Another non-metallic getter formed from deposited amorphous silicon or poly-silicon for flat panel display applications is described in U.S. Pat. No. 5,614,785.

Conventional procedures have been met with varying degrees of success. For instance, with metallic getters there is a serious reliability issue caused by getter particles falling down during fabrication process or after device experiencing vibration or shock due to poor mechanical strength and too large pore size of the used metallic getter. The presence of separated getter particles has been identified as a major failure mode for some micro gyroscopes sealed with porous metallic getters. Additionally, because metallic getters typically have large pore size, the required size of the getter is normally large. This size restriction and the getter fabrication process normally prohibit metallic getters from use in wafer level vacuum seals. Metallic getters are also cost prohibitive for some applications.

With relation to non-metallic getters, the mechanical properties of known amorphous or poly-crystalline silicon will change with deposition condition and are difficult to repeat. Known types of non-metallic getters are typically used in large sized cavities with large planar areas because of their limited thickness of only a couple of microns. Other types of getters are directed to adsorbing moisture within a cavity that is not perfectly hermetic.

It is, therefore, desirable to provide an improved microdevice having a microstructure residing in a hermetically sealed cavity of the microdevice and methods of making the same to overcome most, if not all, of the preceding problems.

BRIEF DESCRIPTION OF THE DRAWINGS

FIGS. 4A–4C are cross-sectional views of one embodiment of a method to assemble the microdevice shown in FIGS. 1A–1C using the substrate portion and the cap portion formed in FIGS. 2A–2G and 3A–3F;

FIGS. 7A–7H are cross-sectional views of one embodiment of a method to form and assemble the microdevice shown in FIGS. 6A–6C;

Figure 1A:
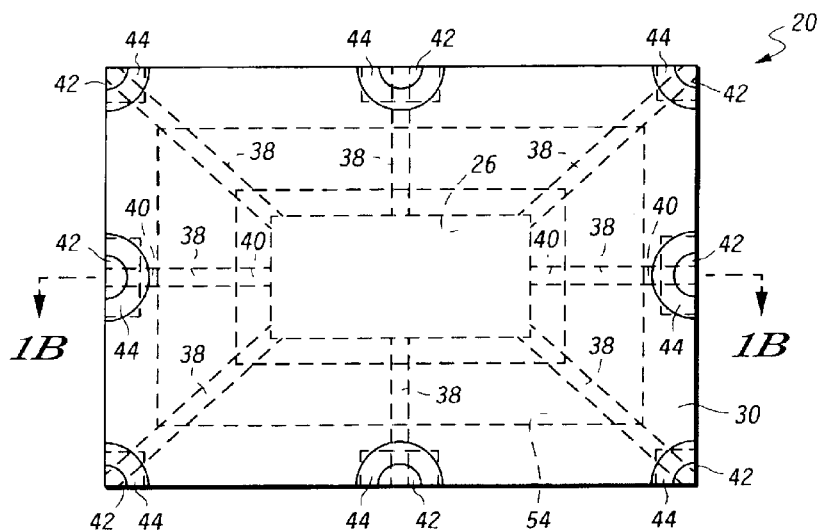
FIG. 1A is a bottom view of one embodiment of a microdevice having conductive feedthroughs for electrically connecting a microstructure in the microdevice to the outside environment.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION

What is described is a microdevice having conductive feedthroughs for electrically connecting a sealed microstructure in the microdevice to the outside environment and methods of making the same. For purposes of illustration and description, an example of a micro gyroscope will be used. However, the present invention is not limited to the making and handling of micro gyroscopes but may also apply to other microdevices and structures that need to be maintained within a vacuum cavity. One of ordinary skill in the art having the benefit of this disclosure will realize that the devices and procedures described herein for making such devices could be used in other applications.

To this end, in one embodiment there is a microdevice having a hermetically sealed cavity to house a microstructure. The microdevice comprises a substrate, a cap and an isolation layer. The substrate has a top side, a bottom side, and an outer edge. The substrate has a plurality of conductive traces formed on at least a portion of its top side and outer edge. The conductive traces formed on the outer edge of the substrate may be the result of a conductive material being deposited on at least a portion of a via that was formed in the substrate during the manufacturing process. The conductive traces provide electrical connection to the electrodes for the microstructure. The cap has a base portion and a sidewall. The sidewall extends outwardly from the base portion to define a recess in the cap. The isolation layer is attached between an outer edge of the sidewall of the cap and the plurality of conductive traces formed on the top side of the substrate. The microstructure is mounted within the hermetically sealed cavity wherein the cavity is at least partially defined by the recess in the cap.

The cap may be made of silicon. If a certain application needs a getter, the silicon cap may then be embedded with a getter layer. For instance, the silicon cap may be fabricated so that it has a single crystalline silicon getter layer embedded along the recess for maintaining a vacuum within the cavity. In one embodiment, the getter is formed by electrochemically etching a silicon wafer into a porous structure. After appropriate activation, the getter is suitable for adsorbing vapors and many gas species. In an alternative embodiment, the porous silicon may be further selectively doped with certain metallic materials such as Titanium (Ti), Palladium (Pd), Platinum (Pt), and Zirconium (Zr) to increase the silicon getter reactivity to certain species. The porous silicon doping can be done by either sputter or evaporation method, or chemical deposition by soaking the porous silicon in aqueous solutions containing the required doping species. Another alternative embodiment includes keeping a thin layer of silicon oxide on the porous silicon surface to increase the getter reactivity with certain types of vapor and gas molecules in some applications.

There is also a method of making a microdevice having a hermetically sealed cavity that comprises the steps of: providing a substrate having a top side and a bottom side; forming a first set of conductive traces on the top side of the substrate; forming an isolation layer over at least a portion of the top side of the substrate; forming a plurality of contact windows in the isolation layer to expose at least a portion of the first set of conductive traces; forming a second set of conductive traces on a portion of the isolation layer and within the plurality of contact windows; forming a microstructure on the substrate; providing a silicon cap having a first side, a second side, and a recess; attaching the first side of the silicon cap to the isolation layer formed on the top side of the substrate such that the recess in the silicon cap houses the microstructure and forms the hermetically sealed cavity. The step of forming an isolation layer over at least the portion of the top side of the substrate may further comprise the step of: depositing a glass layer on the top side of the substrate; and planarizing and polishing an outer surface of the glass layer. The method, in some embodiments, may further comprise the steps of: forming a single crystalline silicon getter layer in the recess of the silicon cap; and activating the getter layer such that the getter layer is capable of adsorbing vapor and gas species generated during the step of attaching the cap to the isolation layer. The method, in other embodiments, may also comprise the steps of: forming at least portions of vias in the substrate that extend from the bottom side of the substrate to the top side of the substrate; and forming via covers where the vias extend at the top side of the substrate. The vias would be metalized and patterned to form metal pads around vias.

There is also a microdevice having a hermetically sealed cavity to house a microstructure that includes a substrate, a cap and a plurality of via covers. The vias and the via covers are located inside the cavity. The substrate has a top side and a bottom side. The substrate has a plurality of electrically conductive vias such that each via extends from the bottom side and terminates at a contact point at the top side of the substrate. The cap has a body portion and a sidewall. The sidewall extends outwardly from the body portion to define a recess in the cap. The cap is attached to the top side of the substrate. The plurality of via covers are attached to the substrate in a region around the contact point at the top side of the substrate to hermetically seal the via. The microstructure is mounted within the hermetically sealed cavity wherein the cavity is at least partially defined by the recess in the cap.

The cap may be made of silicon and, in certain applications, may have a getter formed in the recess. In particular, the getter may be an embedded single crystalline silicon getter layer along the recess to maintain the vacuum within the cavity.

There is also a method of making a microdevice having a hermetically sealed cavity that comprises the steps of: providing a cap having a first side and a second side, the cap made of silicon; forming at least one recess in the first side of the cap; providing a substrate having a top side and a bottom side, the substrate made of an electrically insulating material; forming a plurality of vias in the substrate that extend from the bottom side and to the top side, each via terminating at the top side of the substrate at separate contact points; forming a microstructure on the top side of the substrate; forming a plurality of conductive covers on the top side of the substrate at a region surrounding and covering the contact points; and attaching the first side of the cap to the top side of the substrate such that the recess in the cap houses the microstructure and the conductive covers. The method may further comprise the steps of: forming a getter layer in the recess of the cap; and activating the getter layer such that the getter layer is capable of adsorbing vapor and gas species generated during the step of attaching the cap to the substrate.

In another embodiment, there is a microdevice having a hermetically sealed cavity to house a microstructure that includes a substrate, a cap and a plurality of conductive members. The substrate has a top side and a bottom side. The substrate also has a plurality of conductive traces formed on at least a portion of the top side. The cap is attached to the substrate and has a body portion, a sidewall, a plurality of posts, and a plurality of conductive vias. The sidewall extends outwardly from the body portion to define a recess in the cap. The plurality of posts extends outwardly from the body portion within the recess of the cap and in a spaced apart relationship from the sidewall. Each conductive via is formed within one of the plurality of posts and terminates at an outer end of each post. The plurality of conductive members are each attached between one of the conductive vias and one of the conductive traces. The microstructure is mounted within the hermetically sealed cavity wherein the cavity is at least partially defined by the recess in the cap.

The cap may be made of glass and, in certain applications, may have a getter formed in the inner recess area. In particular, the getter may be a composite metal layer coated on the inner recess surface to assist in maintaining a vacuum in the cavity.

There is also a method of making a microdevice having a hermetically sealed cavity that comprises the steps of: providing a cap having a first side and a second side, the cap made of an electrically insulating material; forming at least one recess in the first side of the cap, the recess defined by a sidewall that extends outwardly from a base portion of the cap, the recess having a plurality of posts within the recess, the posts in a spaced apart relationship from the sidewall; forming a via within each post, the via extending from the second side to the first side of the cap; providing a substrate having a top side and a bottom side, the substrate made of an electrically insulating material; forming a microstructure on the top side of the substrate; forming a plurality of conductive members on the top side of the substrate, the conductive members providing electrical connection to the microstructure; and attaching the first side of the cap to the top side of the substrate such that the recess in the cap houses the microstructure and the conductive members on the substrate enclose the vias in the cap. The attachment of the cap to the substrate forms the hermetically sealed cavity.

Figure 1B:
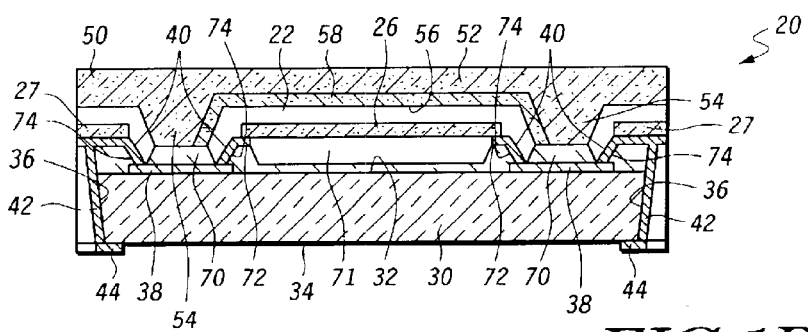
FIG. 1B is a cross-sectional view of the microdevice shown in FIG. 1A across the dashed line 1B—1B.
Figure 1C:
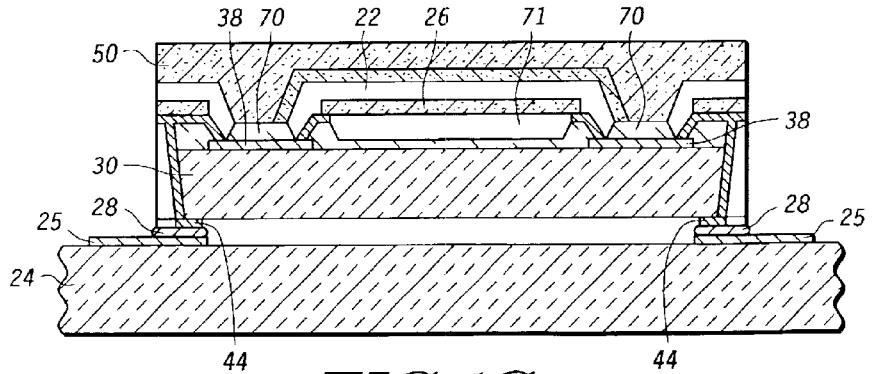
FIG. 1C is a cross-sectional view of the microdevice shown in FIG. 1A across the dashed line 1B—1B when used in a surface mount application.

Turning to the drawings, FIGS. 1A–1C show one embodiment of a microdevice 20 having a hermetically sealed cavity 22 at the wafer level. FIG. 1A shows the bottom view of the microdevice 20 with a plurality of horizontal conductive feedthroughs 38. FIG. 1B is a cross-sectional view of the microdevice 20 across the dashed line 1B—1B shown in FIG. 1A. As seen here, the horizontal conductive feedthroughs 38 in this embodiment extend between a substrate 30 and an isolation layer 70. FIG. 1C is a cross-sectional view of the microdevice 20 mounted to a circuit board 24 as used in a surface mount application.

The microdevice 20 may be a sensor having a microstructure 26 attached to a substrate 30. Here, the microdevice 20 may be the type that can provide sensing capabilities. For example, a micro gyroscope senses angular rate. For purposes of illustration, the description and figures are shown in the context of a sensor. One of ordinary skill in the art with the benefit of this disclosure will recognize, however, that the present invention may apply to other applications.

In one embodiment of the present invention, as shown in FIGS. 1A–1C, the microdevice 20 has a hermetically sealed cavity 22 that houses a microstructure 26. The microdevice 20 may comprise a substrate 30, a cap 50, and an isolation layer 70. The device microstructure 26 may be mounted within the hermetically sealed cavity 22 at various anchor points 72. This allows at least a major body portion of the microstructure 26 to be suspended within the microdevice 20. The microstructure may be a moving structure such as those used for a gyroscope or other microdevices.

The substrate 30 has a top side 32, a bottom side 34, and an outer edge 36. The substrate 30 may also have a first set of conductive traces 38 formed on at least a portion of the top side 32 of the substrate 30. As will be illustrated, the first set of conductive traces 38 in this design is the set of horizontal conductive feedthroughs that electrically connect the microstructure 26 within the cavity 22 to the outside environment. The substrate 30 may further have a second set of conductive traces 40 formed on contact windows 74 in the isolation layer 70. The substrate 30 may also have a third set of conductive traces 42 formed on at least a portion of the outer edge 36. As shown below, in one embodiment, the outer edge 36 may be an inner surface of a via formed during a wafer fabrication process. The third set of conductive traces 42 would then be formed by depositing a layer of conductive material within the formed via.

For surface mounting applications, the substrate 30 may further have a fourth set of conductive traces 44 formed on at least a portion of the bottom side 34 of the substrate 30. As illustrated in FIG. 1C, the conductive traces 44 formed on the bottom side 34 of the substrate 30 may be used to electrically connect the microdevice 20 to circuit traces 25 on a circuit board 24 through conductive attachments 28. The conductive traces 38, 40, 42, 44 are electrically connected and provide the electrical connection between the microstructure 26 and the outside environment.

The cap 50 has a base portion 52 and a sidewall 54. The sidewall 54 extends outwardly from the base portion 52 and defines a recess 56 in the cap 50. The hermetically sealed cavity 22 is at least partially defined by the recess 56 in the cap 50. In one embodiment, the cap 50 is fabricated from a silicon wafer as described below.

As will be shown below, the isolation layer 70 is made of an insulation material such as a glass filler material. The isolation layer 70 provides electrical isolation to avoid shorting between conductive traces 38 through the cap 50.

In a preferred embodiment, the cap 50 is attached to the isolation layer 70 through a non-adhesive type hermetical seal. For instance, the cap 50 and the isolation layer 70 may be attached together through an anodic bonding process in a vacuum. Here, the cap 50 is preferably made of silicon and the isolation layer 70 is preferably made of glass. The outer bonding surface of the isolation layer 70 needs to be planarized and polished. The anodic bonding process includes aligning and clamping the silicon cap 50 and the isolation layer 70, and applying a high voltage between them at a temperature higher than 280° C. At an elevated temperature and a high negative potential, the positive ions inside the glass surface drift away from the glass surface adjacent to the silicon into the bulk of the glass, and a high electric field is generated across the air gap between the glass isolation layer 70 and the silicon cap 50 due to the depletion of positive ions at the interface. The high electrostatic forces clamp two bonding surfaces very tightly to form a strong and uniform bond.

In another embodiment, the cap 50 is attached to the substrate 30 through a frit glass bonding process. Here, a frit glass layer (not shown) is deposited on either the bonding surface of the substrate 30 or the bonding surface of the cap 50. The cap 50 and the substrate 30 are then clamped together such that the glass layer is between the cap 50 and the substrate 30. The assembly is then heated to a melting temperature of the frit glass. Pressure is continuously applied to the wafer assembly during the period under the melting temperature of the frit glass. The cured frit glass layer is not permeable to moisture and forms a hermetic bond between the cap 50 and the substrate 30.

In an additional embodiment, the cap 50 is attached to the substrate 30 using a metal bonding technique such as a gold eutectic bond.

In one embodiment of the present invention, the cap 50 is made of silicon. If the cap 50 is made of silicon, the cap 50 may further have a single crystalline silicon getter layer 58 embedded along the recess 56. The getter layer 58 would be in a spaced-apart relationship from the device microstructure 26. The activated getter layer 58 helps maintain a vacuum within the cavity 22. An embedded single crystalline silicon getter layer 58 in the silicon cap 50 is preferred because it is able to adsorb many vapor and gas species generated during the sealing process and desorpted over the device's lifetime from the materials of the microdevice 20 such as the microstructure 26, substrate 30, and the sealing material in some embodiments.

The porous single crystalline silicon getter layer 58 can be advantageously formed into the silicon cap 50 using an electrochemical etching technique on a silicon wafer. The use of an electrochemical technique for this application is preferred because it allows more flexibility, repeatability, and control in the selection of pore size and pore distribution and porous layer thickness. In the electrochemical etching process, the silicon cap 50 (as part of a plurality of silicon caps on a wafer) may be placed into a HF solution. Depending on the application, the design shown in FIGS. 1A–1C may only need one side of the silicon cap to have an embedded getter layer 58. Accordingly, another side of the wafer retaining the silicon caps 50 should be protected by an etching fixture or otherwise covered with a hard mask material during the porous formation process in the HF solution. In addition, the selective formation of the porous layer is enabled by forming and patterning a hard mask material on the recess side of the wafer that retains the silicon caps 50. In this way, a single crystalline silicon getter layer 58 is formed only along the recess 56 in the silicon cap 50. Selecting doping type and concentration, or porous formation parameters such as HF concentration and current density can advantageously alter the getter layer 58.

If a single crystalline silicon getter layer 58 is used, the getter layer 58 may be activated by different methods such as thermal, electrical or optical methods. For instance, thermal activation at about 400° C. in a vacuum environment for an appropriate duration will remove hydrogen and other species from the porous silicon surface and make it active to vapor and gas species.

In a further alternative embodiment of the present invention, the single crystalline silicon getter layer 58 may be selectively doped with certain types of metallic materials such as Titanium (Ti), Palladium (Pd), Platinum (Pt), and Zirconium (Zr) to increase the silicon getter reactivity to certain species. The doping of the porous silicon can be done by either sputter or evaporation, or chemical deposition by soaking the porous silicon in aqueous solutions containing the required doping species.

In yet a further embodiment, a thin layer of silicon oxide may be kept on the surface of the single crystalline silicon getter layer 58 to increase the getter reactivity with certain types of gas or vapor molecules.

The benefit of using a single crystalline silicon getter layer 58 within recess 56 is that it allows a greater area ratio of active getter surface to outgassing surface than found in known prior art devices. Moreover, the other benefit of using the single crystalline silicon getter is that the exterior getter surface can be modified to further enhance the getter efficiency. For instance, application Ser. No. 10/260,675 entitled "Hermetically Sealed Microdevices Having a Single Crystalline Silicon Getter for Maintaining Vacuum" by Xiaoyi Ding, filed Sep. 30, 2002, commonly owned by the assignee of the present invention and incorporated herein by reference in its entirety, illustrates another design for a silicon cap having a single crystalline silicon getter layer that is corrugated along the bottom surface of a recess in the cap. As taught and explained in that application, the corrugation can be included into the wafer fabrication processing steps of the silicon cap. Alternatively, the getter side of the silicon wafer can be slightly etched with a low concentration KOH solution to rough the surface before porous formation.

Figure 5A:
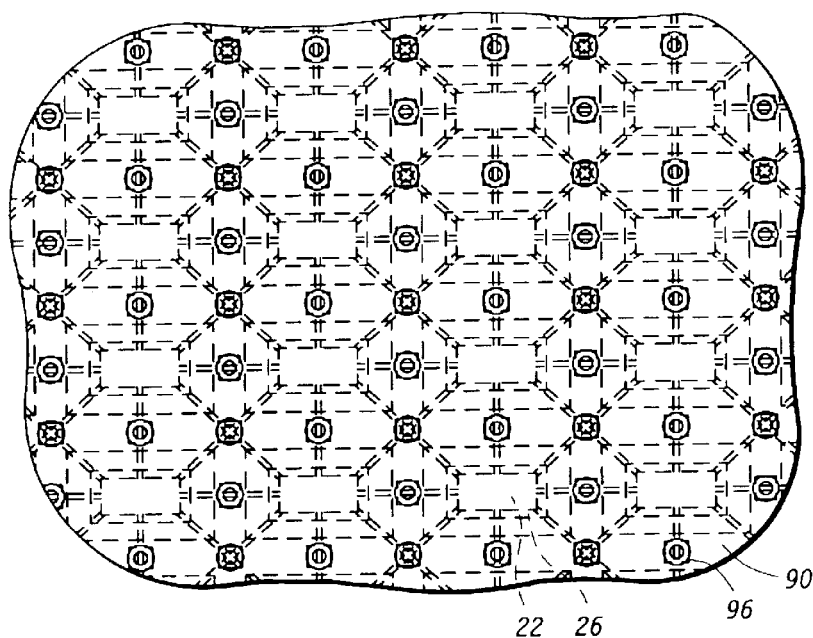
FIG. 5A is a bottom view of a portion of a wafer having a plurality of microdevices, each microdevice having the design as shown in FIGS. 1A–1C.
Figure 5B:
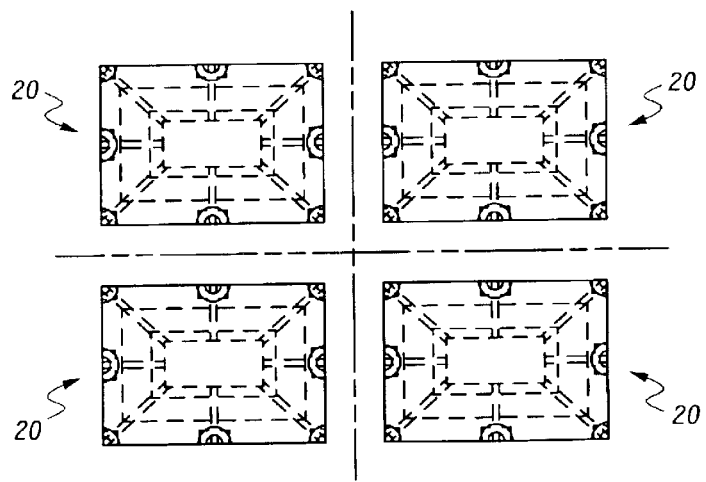
FIG. 5B is a bottom view of a plurality of microdevices after being separated from the wafer illustrated in FIG. 5A.

Now, processes for making microdevice 20 as shown in FIGS. 1A–1C will be further explained. FIGS. 2A–2G illustrate methods of forming a plurality of substrates 30 with isolation layers 70 in a glass wafer 90. FIGS. 3A–3F illustrate methods of forming a plurality of caps 50 in a silicon wafer 80. FIGS. 4A–4C illustrate the steps of assembling the glass wafer 90 and the silicon wafer 80 (along with a third microstructure wafer 100) to form a plurality of microdevices 20. A bottom portion of the assembled wafers is illustrated in FIG. 5A. The assembled wafers may then be sawed or otherwise diced to form a plurality of microdevice 20 as illustrated in FIG. 5B.

Figure 2A:
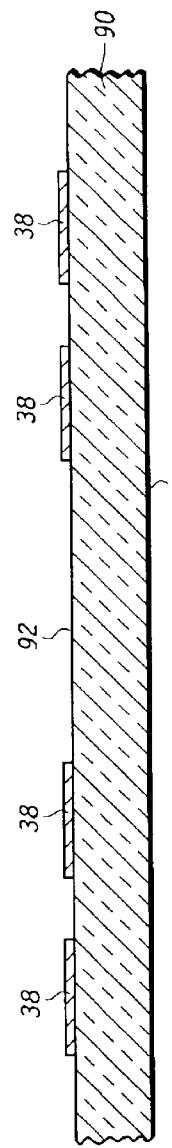
FIGS. 2A–2G are cross-sectional views of one embodiment of a method to form a substrate portion of the microdevice shown in FIGS. 1A–1C.

Turning initially to FIGS. 2A–2G, there is a method of forming a plurality of substrates 30 with isolation layers 70 from a glass wafer 90. Referring to FIG. 2A, a portion of a glass wafer 90 is shown having a top side 92 and a bottom side 94. The process includes the step of forming a first set of conductive traces 38 on the top side 92 of the glass wafer 90. This can be accomplished by depositing and patterning lateral metal traces to the top side 92 of the glass wafer 90. As shown earlier, the first set of conductive traces 38 will eventually be the horizontal conductive feedthroughs for the microdevice 20.

Figure 2B:
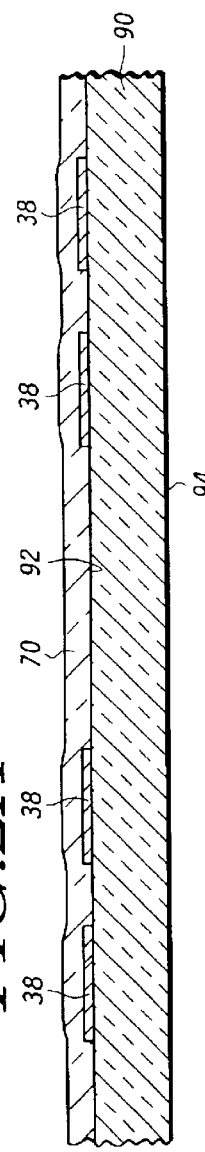
Figure 2C:
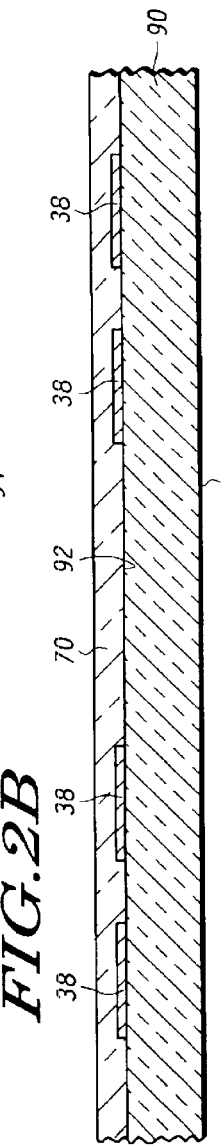

Referring to FIG. 2B, the next step in the process is to coat or deposit an isolation layer 70 over the top side 92 of the glass wafer 90, including over the first set of conductive traces 38 formed thereon. A suitable material for the isolation layer 70 is a glass filler material. In particular, a glass filler material could be coated or deposited on the glass wafer 90 and then hardened through a curing step. If the isolation layer 70 is formed using a glass filler material (and then hardened), the process should also include a step to planarize and polish the top surface of the isolation layer 70 so that the hermetical seal can be done using silicon-to-glass anodic boding. This is illustrated in FIG. 2C. A suitable thickness of isolation layer 70 is about 3 to 5 µm.

Figure 2D:
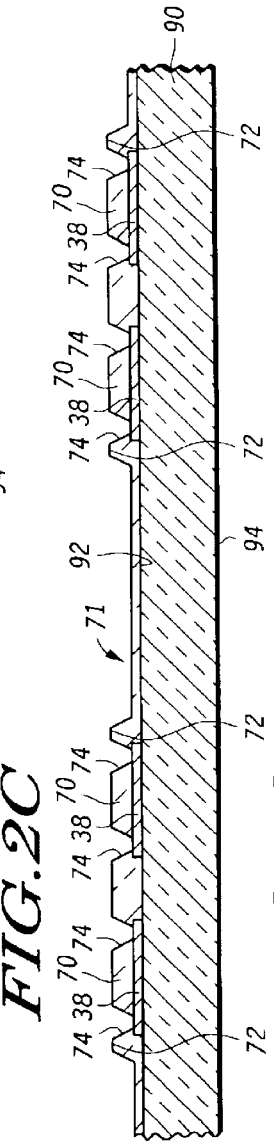

As shown in FIG. 2D, the process should then include a step of forming a plurality of contact windows 74 in the isolation layer 70 to expose the ends of each conductive trace 38. The process further includes a step of forming a gap 71 and anchor points 72 in the isolation layer 70 so that the microstructure 26 is freestanding over the gap 71. If the isolation layer 70 is made of a glass material, the steps of forming the gap 71, anchor points 72, and contact windows 74 could include patterning the isolation layer 70 with a masking layer and then performing either wet etching in a HF-based solution or dry etching such as reactive ion etch.

Figure 2E:
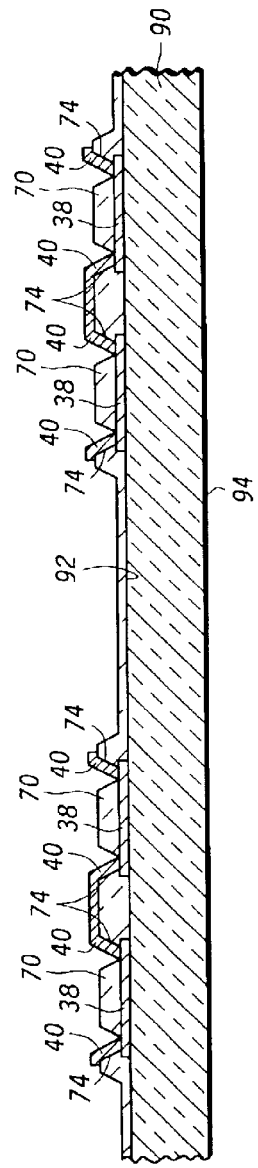

In FIG. 2E, the process further includes a step of forming a second set of conductive traces 40 on portions of the isolation layer 70 and within the contact windows 74 of the isolation layer 70 by metalization and patterning steps.

Figure 2F:
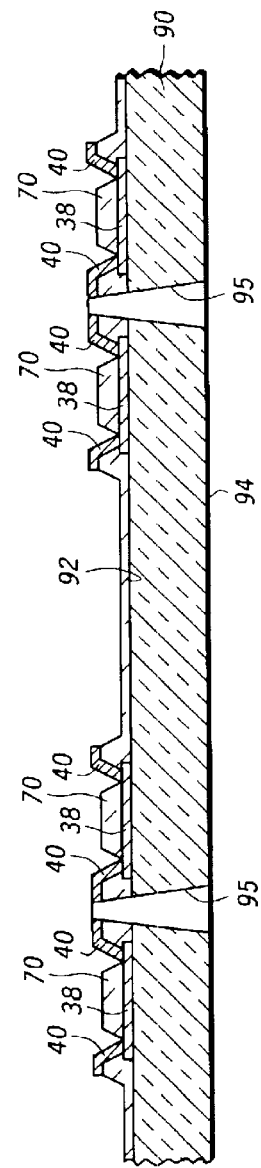

Referring to FIG. 2F, the process may further include a step of forming vias 95 within the glass wafer 90. The available techniques for forming vias 95 include wet etching using hydrofluoric acid, sand blasting, laser drilling, and ultrasonic etching. As mentioned above, in one embodiment, the inner surface of the vias 95 will define a portion of the outer edge 36 of the substrate 30. A benefit of the process described herein is that the vias (and other processes to the glass wafer 90) are performed prior to bonding microstructures 26 to the glass wafer 90.

Figure 2G:
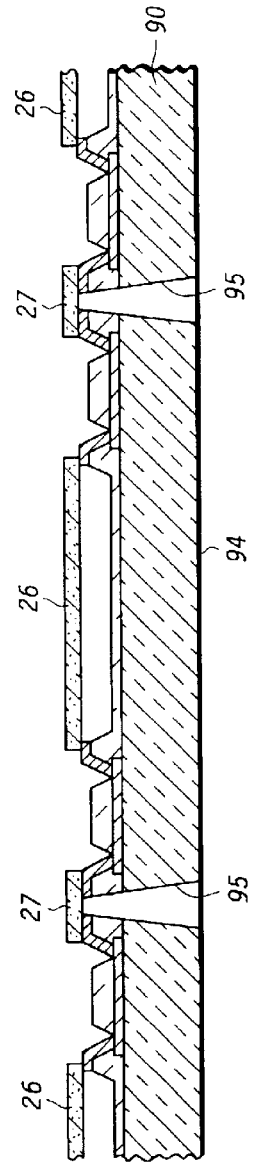

The rest of the process for fabricating the substrate of microdevice 20 is to form the silicon microstructure 26 and via covers 27 on the glass substrate 90. The complete microdevice substrate is shown in FIG. 2G. Both microstructure 26 and via covers 27 are preferred to be made from the same silicon wafer and with the same thickness.

Now referring to FIGS. 3A–3F, there is a method of forming a plurality of caps 50 from a silicon wafer 80. Different doping types and crystalline orientations of the silicon wafer can be used. However, a P-type, (100) silicon wafer is chosen in the following explanation of the process for making the hermetically sealed microdevices having a getter layer 58 embedded in the silicon cap 50. Although the method taught here shows one way of forming a getter layer 58 in the cap 50, other techniques to form a getter layer within the recess 56 may be used. Additionally, FIGS. 3A–3F illustrate the formation of a silicon cap 50 having a relatively flat single crystalline silicon getter layer 58. The getter layer could also be corrugated similar to that taught and described in application Ser. No. 10/260,675 entitled "Hermetically Sealed Microdevices Having a Single Crystalline Silicon Getter for Maintaining Vacuum" by Xiaoyi Ding, filed Sep. 30, 2002.

Figure 3A:
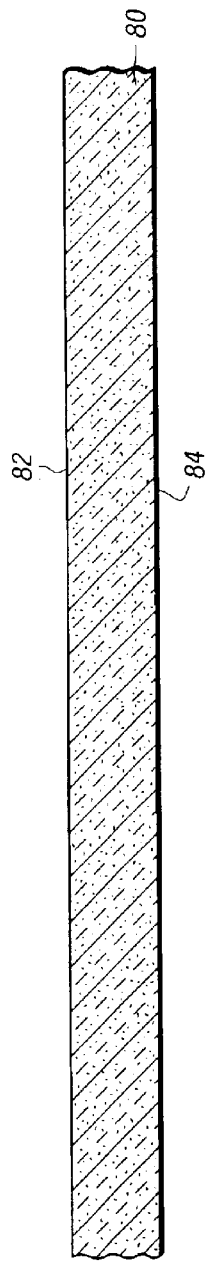
FIGS. 3A–3F are cross-sectional views of one embodiment of a method to form a cap portion of the microdevice shown in FIGS. 1A–1C.
Figure 3B:
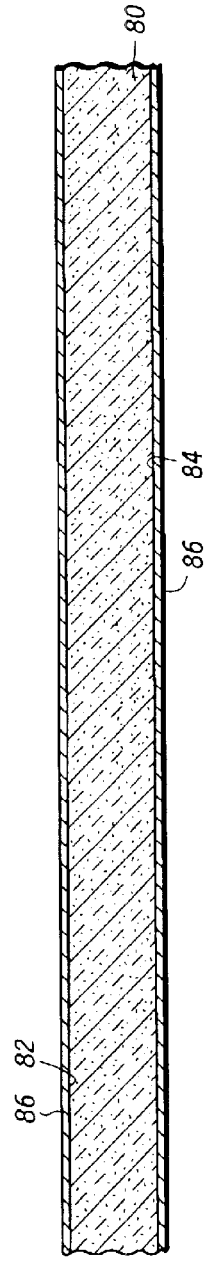
Figure 3C:
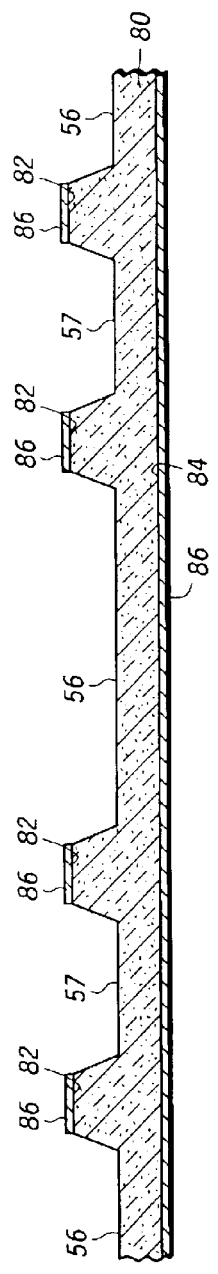

Referring to FIG. 3A, a portion of a silicon wafer 80 is shown having a first side 82 and a second side 84. The process includes the step of forming recesses 56 and 57 on the first side 82 of the silicon wafer 80. The recesses 56 and 57 on the first side 82 of the wafer 80 may be formed using known micromachining methods. In one embodiment, as shown in FIGS. 3B and 3C, a masking material 86, for instance a composite layer of silicon dioxide and silicon nitride is formed and patterned before the etching of the recesses 56 and 57. In FIG. 3C, the recesses 56 and 57 may be formed in the first side 82 of the wafer 80 using techniques such as plasma etching by deep reactive ion etching (DRIE) or anisotropic wet chemical etching by potassium hydroxide (KOH), ethylenediamine pyrocatechol (EDP) or tetramethyl ammonium hydroxide (TMAH). The depth of the recesses 56 on the first side 82 of the wafer 80 is application specific and depends on the desired thickness of the silicon cap 50, the thickness of the desired getter layer 58, and the desired size of the cavity surrounding a microstructure. In one example, where the desired thickness of the silicon cap 50 is to be about 600 µm, etching may be performed for sufficient time to define the recesses having a depth of about 50 µm. As will be shown, the recesses 56 will be used to define at least a portion of the hermetically sealed cavity 22. The recesses 57 are located over the via covers 27 on the substrate wafer 90, and are not used to define portions of the hermetically sealed cavity 22.

Figure 3D:
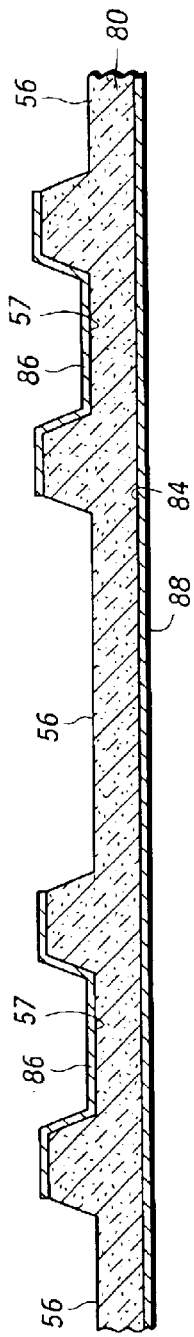

Additional steps may be included in the silicon wafer fabrication process if one desires to form a single crystalline silicon getter layer 58 in recesses 56. As shown in FIG. 3D, a new masking material 86 is created on both sides of wafer 80 and patterned on the first side 82 for selective formation of the getter layer 58 on recesses 56. Additionally, the masking material 86 on the second side 84 of the wafer 80 should be completely removed and replaced with a thin metal layer 88 that is deposited on the second side 84 of the silicon wafer 80. The thin metal layer will provide a uniform conductance across the silicon wafer 80 during the porous formation step. A suitable thin metal layer 88 in one embodiment is about 1 µm thick aluminum.

Figure 3E:
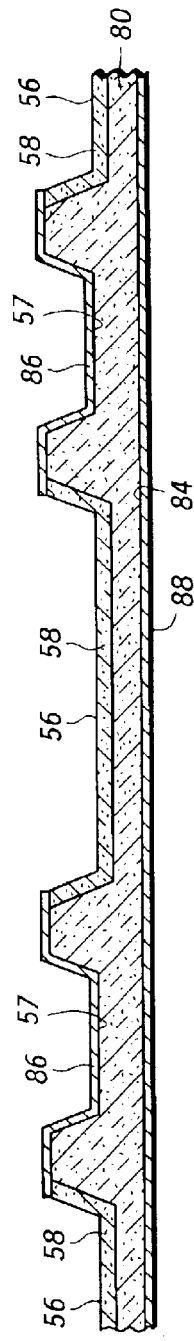
Figure 3F:
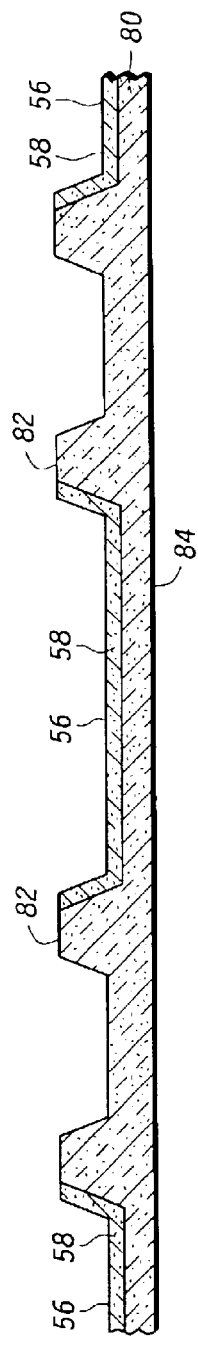

The step of forming a single crystalline silicon getter layer 58 in the first set of recesses 56 is illustrated in FIG. 3E. As mentioned above, the getter layer 58 may be formed by performing the electrochemical etching in a HF solution. The use of an electrochemical technique for this application is preferred over depositing techniques because it allows more flexibility, repeatability, and control in the selection of pore size, pore distribution, and porous layer thickness. The thickness of the getter layer 58 is application specific and depends on the size of the cavity and amount of gas molecules to be adsorbed over the device lifetime. In one application having a design similar to that shown in FIGS. 1A–1C, the volume of the internal cavity 22 was about $9 \times 10^{-4}$ cm$^3$ and the internal surface area of both the silicon cap 50 and the substrate 30 was about $2 \times 10^{-5}$ cm$^2$. A suitable porous silicon getter layer 58 was selected to have a volume of about $1.8 \times 10^{-3}$ cm$^3$ along the recess 56. This provides an advantageous larger ratio of active getter surface area to out gassing surface area than known prior art devices. After a getter layer 58 is formed in the wafer 80, the masking material 86 and the metal layer 88 on wafer 80 are removed as shown in FIG. 3F.

The next step, as shown in FIGS. 4A–4C, is to assemble the glass wafer 90 (having a plurality of device substrates) to the silicon wafer 80 (having a plurality of caps 50). As shown in FIG. 4A, the assembly process includes a step of aligning the glass wafer 90 with silicon wafer 80 in such a way that the recesses 56 and 57 will be on top of the corresponding microstructure 26 and via covers 27, respectively. Initially, a small gap should exist between the silicon wafer 80 and the glass wafer 90. The wafer assembly is then subjected to a vacuum and an elevated temperature. This allows for an initial degassing of the materials included in the microdevice.

If the microdevice 20 includes a getter layer 58, the process would then further include a step of activating the getter layer 58. As mentioned above, in one embodiment, the getter layer 58 is activated through a thermal, electrical, or optical process to remove hydrogen and other species from the silicon getter surface. This frees the dangling bonds on the silicon getter surface to act as reactive units for adsorbing vapor and gas species. In one embodiment, the activation step may be performed just prior to or during the bonding of the silicon wafer 80 to the glass wafer 90.

Referring to FIG. 4B, the process includes the step of bonding the silicon wafer 80 to the glass wafer 90 in a vacuum environment by using either an anodic bonding, frit glass bonding, or metal bonding technique as described in more detail above. Also shown in FIG. 4B, a metal layer is deposited on the inner walls of vias 95 and the bottom side 94 of the glass wafer 90 to define the second and third sets of conductive traces 42 and 44 described above. This will also form the conductive via 96.

Finally, as illustrated in FIG. 4C, the next step in the process is to dice the wafer assembly into individual microdevices 20.

A further benefit of the process described herein is illustrated in FIGS. 5A and 5B. A portion of the bottom side of the wafer assembly built in the step associated with FIG. 4B is shown in FIG. 5A. The conductive vias 96 formed in the glass wafer 90 are located outside of the hermetically sealed cavity 22 and shared with adjacent devices. The conductive vias 96 are also located along the saw lines of the wafer. After the assembled wafer is diced, the conductive material formed within the vias can then be used as the conductive traces 40 that run along a portion of the outer edge 36 of the substrate 30. FIG. 5B shows a plurality of microdevices 20 after the assembled wafer is diced. One advantage of this design is that the conductive vias 96 do not need to be hermetically sealed because they are outside of the vacuum cavity 22. In this case, the cracks and other defects on the conductive vias 96 and the via covers 27 will not affect the cavity vacuum 22. Another advantage is that this design allows a small die size compared with other designs having vias inside the vacuum cavity.

Figure 6A:
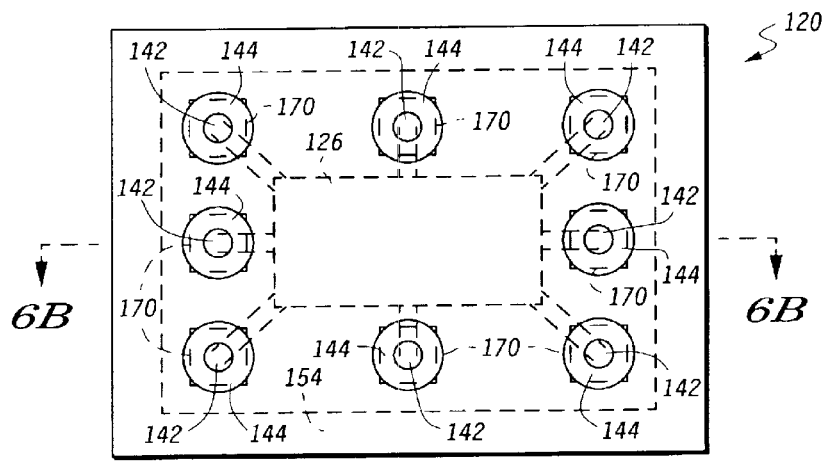
FIG. 6A is a bottom view of another embodiment of a microdevice having conductive feedthroughs for electrically connecting a microstructure in the microdevice to the outside environment.
Figure 6B:
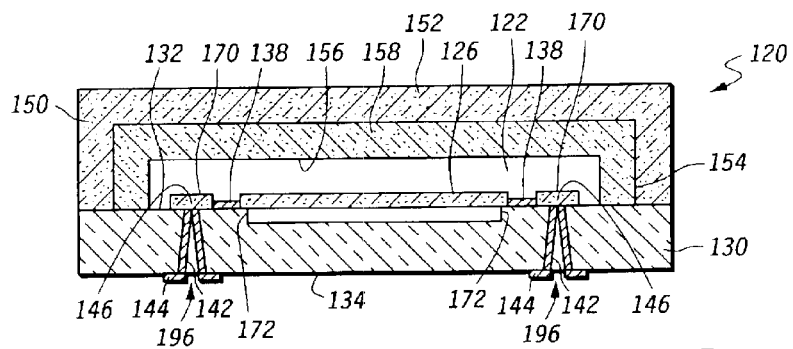
FIG. 6B is a cross-sectional view of the microdevice shown in FIG. 6A across the dashed line 6B—6B.
Figure 6C:
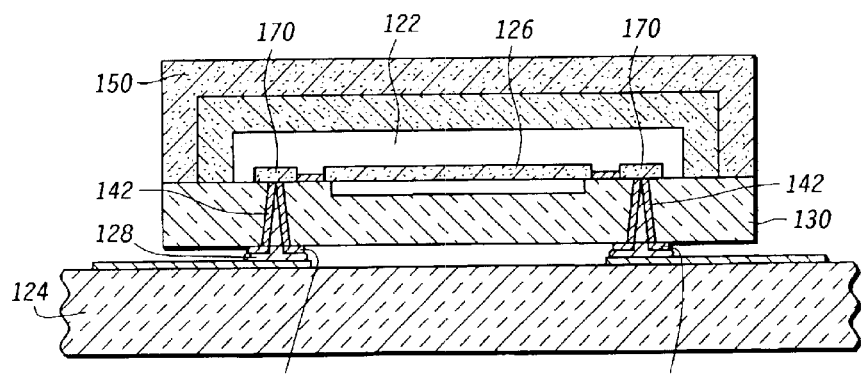
FIG. 6C is a cross-sectional view of the microdevice shown in FIG. 6A across the dashed line 6B—6B when used in a surface mount application.

Referring to FIGS. 6A–6C, in another embodiment of the present invention, there is a microdevice 120 having a hermetically sealed cavity 122 at the wafer level. FIG. 6A shows the bottom view of the microdevice 120 with a plurality of vertical conductive feedthroughs 142. FIG. 6B is a cross-sectional view of the microdevice 120 across the dashed line 6B—6B shown in FIG. 6A. As seen here, the vertical conductive feedthroughs 142 in this embodiment extend through a substrate 130 and terminate at a point within the hermetically sealed cavity 122. FIG. 6C is a cross-sectional view of the microdevice 120 mounted to a circuit board 124 as used in a surface mount application.

In this embodiment, the microdevice 120 may also be a sensor having a microstructure 126 attached to the substrate 130. The microdevice 120 may comprise a substrate 130, a cap 150, and a plurality of via covers 170. The device microstructure 126 may be mounted within the hermetically sealed cavity 122 at various anchor points 172. This allows at least a major body portion of the microstructure 126 to be suspended within the microdevice 120. The microstructure may be a moving structure such as those used for a gyroscope or other microdevices.

The substrate 130 has a top side 132 and a bottom side 134. The substrate 130 may also have a first set of conductive traces 138 formed on at least a portion of the top side 132 of the substrate 130. The substrate 130 further has a second set of conductive traces 142 that extend vertically through the body of the substrate 130. The substrate may further have a third set of conductive traces 144 that are formed on at least a portion of the bottom side 134 of the substrate 130. As will be further illustrated below, the conductive traces 138, 142, 144 are electrically connected and provide the electrical connection between the microstructure 126 and the outside environment.

For instance, a set of through-wafer vias 195 are formed to provide an electrical access to the microstructure 126 by terminating at a set of contact points 146 on the top side 132 of the substrate 130. The contact points 146 are then connected (through a set of conductive covers 170) to the first set of conductive traces 138. The first set of conductive traces 138 extend from the device microstructure 126. The vias 195 need to be hermetically sealed. One way to provide a hermetic seal for the vias 195 is through the use of conductive covers 170. In one embodiment, the conductive covers 170 are made of silicon and attached to the substrate 130 in a region around the contact points 146. The conductive covers 170 are preferably formed from the same silicon wafer that the device microstructure 126 is formed. Moreover, the conductive covers 170 have preferably the same thickness as the device microstructure 126. Making the conductive covers 170 out of the same silicon wafer as the device microstructure 126 reduces the complexity of the manufacturing process. The conductive covers 170 are preferably attached to the substrate 130 by the same step of bonding the silicon for the microstructure 126 to the substrate 130.

An alternative process to hermetically seal the vias 195 is to use an appropriate solder ball. The process steps include placing the solder ball onto the via from the bottom side 134 of the substrate 130; performing solder ball degassing; and melting the ball in vacuum to hermetically seal the via 195.

A benefit of this vertical through-wafer via design is that it enables the sealed microdevice 120 to be easily attached to a circuit board 124 using a surface mounting technique. This is illustrated in FIG. 6C.

The cap 150 has a base portion 152 and a sidewall 154. The sidewall 154 extends outwardly from the base portion 152 and defines a recess 156 in the cap 150. The hermetically sealed cavity 122 is at least partially defined by the recess 156 in the cap 150. In this embodiment, the cap 150 can be made from a silicon wafer as will be shown below.

In a preferred embodiment, the cap 150 is attached to the substrate 130 through a non-adhesive type hermetic seal. For instance, the cap 150 and the substrate 130 may be attached together through an anodic bonding process in a vacuum. Here, the cap 150 is preferably made of silicon and the substrate 130 is preferably made of glass. The anodic bonding process includes aligning and clamping the silicon cap 150 and the substrate 130, and applying a high voltage between them at a temperature higher than 280° C. At an elevated temperature and a high negative potential, the positive ions inside the glass drift away from the glass surface adjacent to the silicon into the bulk of the glass, and a high electric field is generated across the air gap between the glass substrate 130 and the silicon cap 150 due to the depletion of positive ions at the interface. The high electrostatic forces clamp two bonding surfaces very tightly to form a strong and uniform bond.

In another embodiment, the cap 150 is attached to the substrate 130 through a frit glass bonding process. Here, a frit glass layer (not shown) is deposited on either the bonding surface of the substrate 130 or the bonding surface of the cap 150. The cap 150 and the substrate 130 are then clamped together such that the glass layer is between the cap 150 and the substrate 130. The assembly is then heated to a melting temperature of the frit glass. Pressure is continuously applied to maintain contact between the cap 150 and the substrate 130 during the period under the melting temperature of the frit glass. The cured frit glass layer is not permeable to moisture and forms a hermetic bond between the cap 150 and the substrate 130.

In an additional embodiment, the cap 150 is attached to the substrate 130 using a metal bonding technique such as a gold eutectic bond.

In one embodiment of the present invention, the cap 150 is made of silicon and may further have a single crystalline silicon getter layer 158 embedded along the recess 156. This allows the getter layer 158 to be in a spaced-apart relationship from the device microstructure 126. The getter layer 158 helps maintain a vacuum within the cavity 122 after being activated. An embedded single crystalline silicon getter layer 158 in the silicon cap 150 is preferred because it is able to adsorb many vapor and gas species generated during the sealing process and desorpted over the device's lifetime from the materials of the microdevice 120 such as the microstructure 126, substrate 130, and the sealing material in some embodiments.

If a porous single crystalline silicon getter layer 158 is used, the getter layer 158 can be advantageously formed into the silicon cap 150 using an electrochemical etching technique on a silicon wafer. The use of an electrochemical technique for this application is preferred because it allows more flexibility, repeatability, and control in the selection of pore size and pore distribution and porous layer thickness. In the electrochemical etching process, the silicon cap 150 (as part of a plurality of silicon caps on a wafer) may be placed into a HF solution. The design in FIGS. 6A–6C only shows one side of the silicon cap having an embedded getter layer. Accordingly, another side of the wafer retaining the silicon caps 150 needs to be protected by an etching fixture or otherwise covered with a hard mask material during the porous formation process in the HF solution. In addition, the selective formation of the porous layer is enabled by forming and patterning a hard mask material on the recess side of the wafer that retains the silicon caps 150. In this way, a single crystalline silicon getter layer 158 is formed only along the recess 156 in the silicon cap 150. Selecting doping type and concentration, or porous formation parameters such as HF concentration and current density can advantageously alter the getter layer 158.

The single crystalline silicon getter layer 158 may be activated by different methods such as thermal, electrical or optical methods. For instance, thermal activation at about 400° C. in a vacuum environment for an appropriate duration will remove hydrogen and other species from the porous silicon surface and make it active to vapor and gas species.

In an alternative embodiment of the present invention, the single crystalline silicon getter layer 158 may be further selectively doped with certain types of metallic materials such as Titanium (Ti), Palladium (Pd), Platinum (Pt), and Zirconium (Zr) to increase the silicon getter reactivity to certain species. The doping of the porous silicon can be done by either sputter or evaporation, or chemical deposition by soaking the porous silicon in aqueous solutions containing the required doping species.

In yet a further embodiment, a thin layer of silicon oxide may be kept on the surface of the single crystalline silicon getter layer 158 to increase the getter reactivity with certain types of gas or vapor molecules.

Similar to the benefits described above with relationship to FIGS. 1A–1C, the benefit of using a single crystalline silicon getter layer 158 is that it allows a greater area ratio of active getter surface to outgassing surface than found in known prior art devices. Moreover, the other benefit of using the single crystalline silicon getter is that the exterior getter surface can be modified to further enhance the getter efficiency. For instance, application Ser. No. 10/260,675 entitled "Hermetically Sealed Microdevices Having a Single Crystalline Silicon Getter for Maintaining Vacuum" by Xiaoyi Ding, filed Sep. 30, 2002, commonly owned by the assignee of the present invention and incorporated herein by reference in its entirety, illustrates another design for a silicon cap having a single crystalline silicon getter layer that is corrugated along the bottom surface of a recess in the cap. As taught and explained in that application, the corrugation can be included into the wafer fabrication processing steps of the silicon cap. Alternatively, the getter side of the silicon wafer can be slightly etched with a low concentration KOH solution to rough the surface before porous formation.

Now, processes for making microdevice 120 as shown in FIGS. 6A–6C will be further explained. Although different doping types and crystalline orientations of the silicon wafer can be used, a P-type, (100) silicon wafer is chosen in the following explanation of the process for making the hermetically sealed microdevices having a getter layer 158 embedded in the silicon cap 150. FIGS. 7A–7H illustrate the formation of microdevices with a silicon cap 150 having a relatively flat single crystalline silicon getter layer 158. The getter layer could also be corrugated similar to that taught and described in application Ser. No. 10/260,675 entitled "Hermetically Sealed Microdevices Having a Single Crystalline Silicon Getter for Maintaining Vacuum" by Xiaoyi Ding, filed Sep. 30, 2002.

Figure 7A:
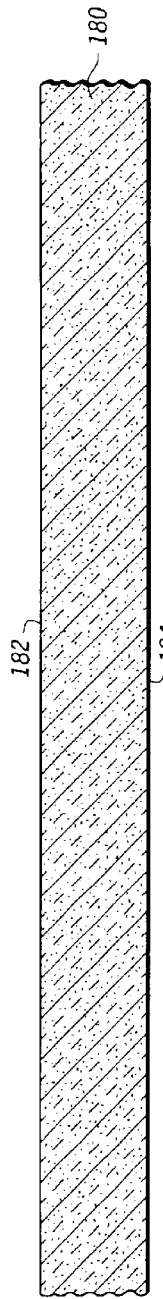
Figure 7B:
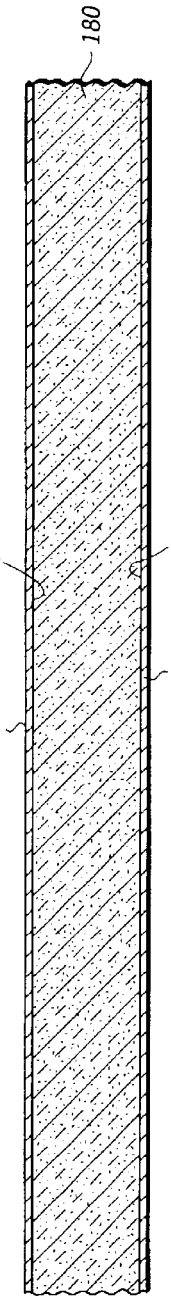
Figure 7C:
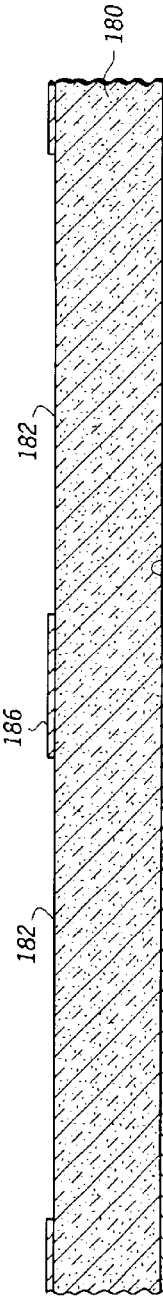
Figure 7D:
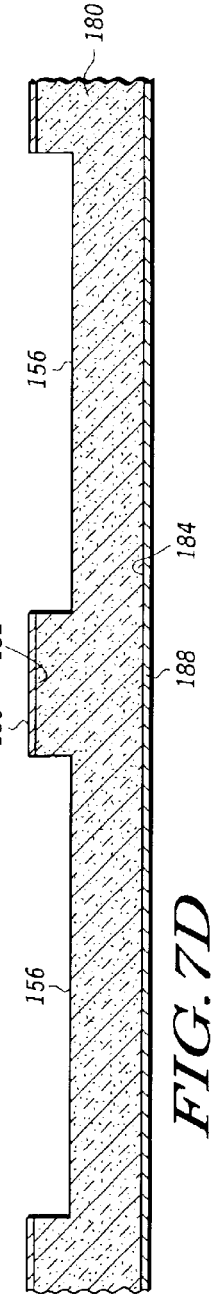

Referring to FIG. 7A, a portion of a silicon wafer 180 is shown having a first side 182 and a second side 184. The process includes the step of forming at least one recess 156 on the first side 182 of the silicon wafer 180. The recess 156 on the first side 182 of the wafer 180 may be formed using known micromachining methods. In one embodiment, as shown in FIGS. 7B and 7C, a masking material 186, for instance a composite layer of silicon dioxide and silicon nitride is formed and patterned before the etching of the recesses 156. During the step for the selective etching of the masking material 186 on the first side 182 to form a recess window as shown in FIG. 7C, the masking material 186 on the second side 184 of the wafer 180 is also removed completely. For providing a uniform conductance during a later porous formation step, a thin metal layer 188, for instance about 1 μm thick aluminum, is deposited on the second side 184 as shown in FIG. 7C. In FIG. 7D, the recesses 156 may be formed in the first side 182 of the wafer 180 using either plasma etching such as deep reactive ion etching (DRIE) or anisotropic wet chemical etching by potassium hydroxide (KOH), ethylenediamine pyrocatechol (EDP) or tetramethyl ammonium hydroxide (TMAH). The depth of the recesses 156 on the first side 182 of the wafer 180 is application specific and depends on the desired thickness of the silicon cap 150, the thickness of the desired getter layer 158, and the desired size of the cavity surrounding a microstructure. In one example, where the desired thickness of the silicon cap 150 is to be about 600 μm, etching may be performed for sufficient time to define the recesses having a depth of about 50 μm.

As shown in FIG. 7E, the next step is the formation of a single crystalline silicon getter layer 158 in the recess 156 of the first side 182 of the wafer 180. As mentioned above, the getter layer 158 may be formed by performing the electrochemical etching in a HF solution. The use of an electrochemical technique for this application is preferred over depositing techniques because it allows more flexibility, repeatability, and control in the selection of pore size, pore distribution, and porous layer thickness. The thickness of the getter layer 158 is application specific and depends on the size of the cavity and amount of gas molecules to be adsorbed over the device lifetime. In one application having a design similar to that shown in FIGS. 6A–6C, the volume of the internal cavity 122 was about $9 \times 10^{-4}$ cm$^3$ and the internal surface area of both the silicon cap 150 and the substrate 130 was about $2 \times 10^{-5}$ cm$^2$. A suitable porous silicon getter layer 158 was selected to have a volume of about $1.8 \times 10^{-3}$ cm$^3$ along the recess 156. This provides an advantageous larger ratio of active getter surface area to out gassing surface area than known prior art devices. After a getter layer 158 is formed in the wafer 180, the masking material 186 and the metal layer 188 on wafer 180 are removed as shown in FIG. 7F.

The next step, as shown in FIG. 7G, is to align the silicon wafer 180 (having a plurality of caps 150) with a microdevice substrate wafer 190 (having a plurality of microdevice dies) so that the recess 156 of each silicon cap 150 resides adjacent to a corresponding microdevice die and conductive covers 170 enclose corresponding vias 195. Initially, a small gap should exist between the silicon wafer 180 and the microdevice wafer 190. The wafer assembly is then subjected to a vacuum and an elevated temperature. This allows for an initial degassing of the materials included in the microdevice. The process further includes a step of activating the getter layer 158. As mentioned above, in one embodiment, the getter layer 158 is activated through a thermal, electrical, or optical process to remove hydrogen and other species from the silicon getter surface. This frees the dangling bonds on the silicon getter surface to act as reactive units for adsorbing vapor and gas species. In one embodiment, the activation step may be performed just prior to or during the bonding of the silicon wafer 180 to the microdevice wafer 190.

The process may further include attaching or otherwise bonding the silicon wafer 180 to the microdevice wafer 190. The bonding step is preferably done in a vacuum environment. The silicon wafer 180 may be attached to the microdevice wafer 190 by using anodic bonding, frit glass bonding or metal bonding techniques.

The rest of the steps in the process include metalizing and patterning the vias 195 to form conductive traces 142 and 144 (this will form conductive vias 196); and dicing the wafer assembly into individual microdevices as shown in FIG. 7H.

Figure 8A:
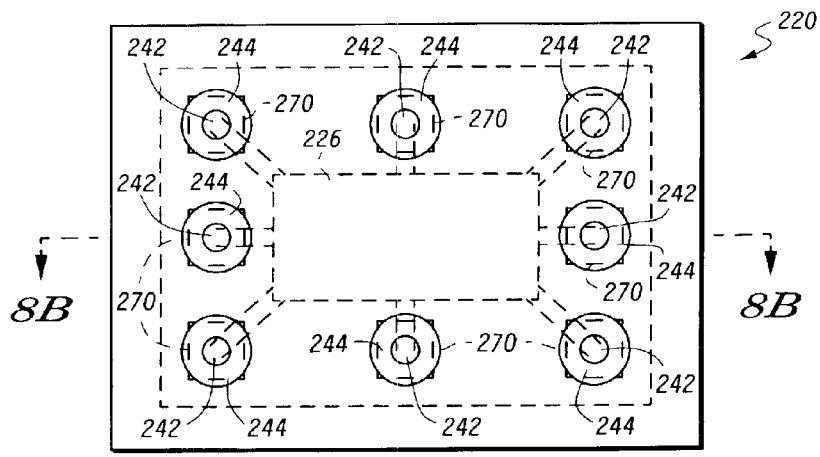
FIG. 8A is a top view of another embodiment of a microdevice having conductive feedthroughs for electrically connecting a microstructure in the microdevice to the outside environment.
Figure 8B:
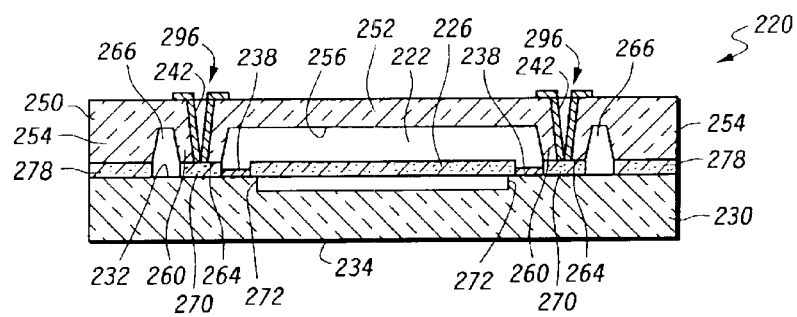
FIG. 8B is a cross-sectional view of the microdevice shown in FIG. 8A across the dashed line 8B—8B.
Figure 8C:
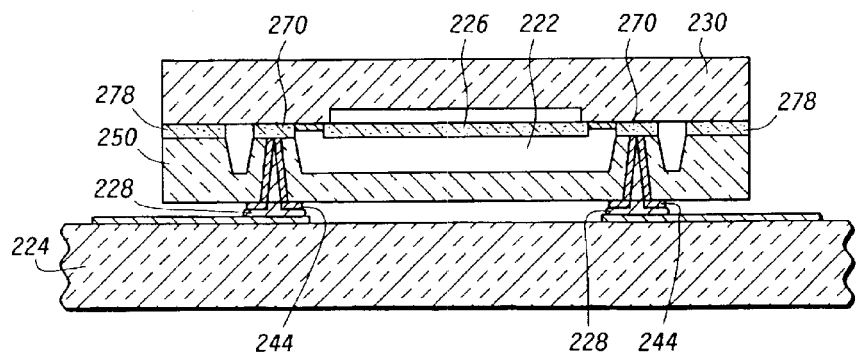
FIG. 8C is a cross-sectional view of the microdevice shown in FIG. 8A across the dashed line 8B—8B when used in a surface mount application.

Referring now to FIGS. 8A–8C, in another embodiment of the present invention, there is a microdevice 220 having a hermetically sealed cavity 222 at the wafer level. FIG. 8A shows the top view of the microdevice 220 with a plurality of vertical conductive feedthroughs 242. FIG. 8B is a cross-sectional view of the microdevice 220 across the dashed line 8B—8B shown in FIG. 8A. As seen here, the vertical conductive feedthroughs 242 in this embodiment extend through posts 260 in a cap 250 and terminate at a conductive member 270 that is attached to the surface of the substrate 230. FIG. 8C is a cross-sectional view of the microdevice 220 mounted to a circuit board 224 as used in a surface mount application.

In this embodiment, the microdevice 220 may also be a sensor having a microstructure 226 attached to the substrate 230. The microdevice 220 may comprise a substrate 230, a cap 250, a plurality of conductive members 270, and an outer sealing ring 278. The device microstructure 226 may be mounted within the hermetically sealed cavity 222 at various anchor points 272. This allows at least a major body portion of the microstructure 226 to be suspended within the microdevice 220. The microstructure may be a moving structure such as those used for a gyroscope or other microdevices.

The substrate 230 has a top side 232 and a bottom side 234. The substrate 230 may also have a first set of conductive traces 238 formed on at least a portion of the top side 232 of the substrate 230. Each conductive traces 238 electrically connects one of the electrodes of the microstructure 226 and one of the corresponding conductive members 270.

The cap 250 has a base portion 252, a sidewall 254, a plurality of posts 260, and a plurality of conductive vias 296. The sidewall 254 extends outwardly from the base portion 252 and defines a recess 256 in the cap 250. The hermetically sealed cavity 222 is at least partially defined by the recess 256 in the cap 250. The plurality of posts 260 extend outwardly from the base portion 252 to an outer end 264. The plurality of posts 260 are contained within the recess 256 such that they are in a spaced apart relationship with the sidewall 254. This spaced apart relationship is defined by isolation gaps 266 in the cap 250 between the posts 260 and the sidewall 254. The isolation gaps 266 provide a benefit of increasing the inner cavity size to minimizing the residual cavity pressure. Each conductive via 296 is formed within one of the plurality of posts 260 and terminates at the outer end 264 of each post 260. In this embodiment, the cap 250 can be made from a glass wafer as will be shown below. The conductive via 296 may be a hole etched in the cap 250 and filed or deposited with a layer of conductive material 242.

The set of conductive vias 296 formed in the cap 250 provide an electrical access to the microstructure 226 by terminating at the outer end 264. Each outer end 264 of the posts 260 is attached to one of the conductive members 270. The conductive members 270 connect the conductive vias 296 with corresponding conductive traces 238.

In one embodiment, the conductive members 270 are made of silicon and attached to the substrate 230 in a region where the outer ends 264 of the posts 260 meet the substrate 230. The conductive members 270 are preferably formed from the same silicon wafer that the device microstructure 226 is formed. Moreover, the conductive members 270 are preferably the same thickness as the device microstructure 226. Making the conductive covers 270 out of the same silicon wafer as the device microstructure 226 reduces the complexity of the manufacturing process. The conductive members 270 hermetically seal the vias 296 after attaching the cap wafer 250 to the substrate wafer 230 by using anodic bonding technique.

One of several benefits of this vertical through-wafer via design is that it enables the sealed microdevice 220 to be easily attached to a circuit board 224 through a surface mounting technique. This is illustrated in FIG. 8C.

In a preferred embodiment, the cap 250 is attached to the substrate 230 through a non-adhesive type hermetical seal. For instance, the cap 250 and the substrate 230 may be attached together using an outer sealing ring 278 and an anodic bonding process in a vacuum. Here, the cap 250 and the substrate 230 may be made of glass. The outer sealing ring 278 may be made of the same silicon and have the same thickness as the microstructure 226 and the conductive member 270. The anodic bonding process includes aligning and clamping the glass cap 250 and the glass substrate 230, and applying a high voltage between them at a temperature higher than 280° C. At an elevated temperature and a high negative potential, the positive ions inside the glass drift away from the glass surface adjacent to the silicon into the bulk of the glass, and a high electric field is generated across the air gap between the glass structures and the silicon ring due to the depletion of positive ions at the interface. The high electrostatic forces clamp two bonding surfaces very tightly to form a strong and uniform bond.

In an alternative embodiment, the inner surface of the recess 256 on the cap 250 may be deposited with a metallic getter layer to assist in maintaining a vacuum in the cavity 222.

Figure 9A:
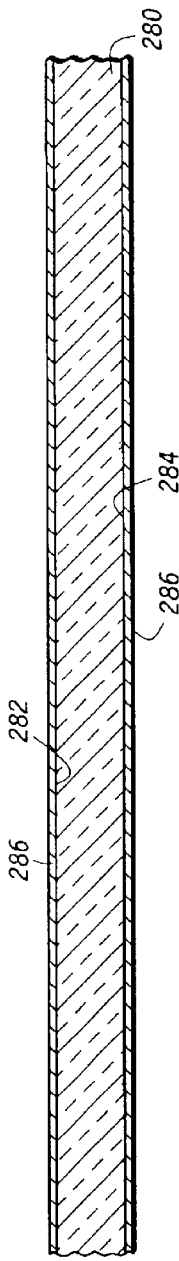
FIGS. 9A–9F are cross-sectional views of one embodiment of a method to form and assemble the microdevice shown in FIGS. 8A–8C.
Figure 9B:
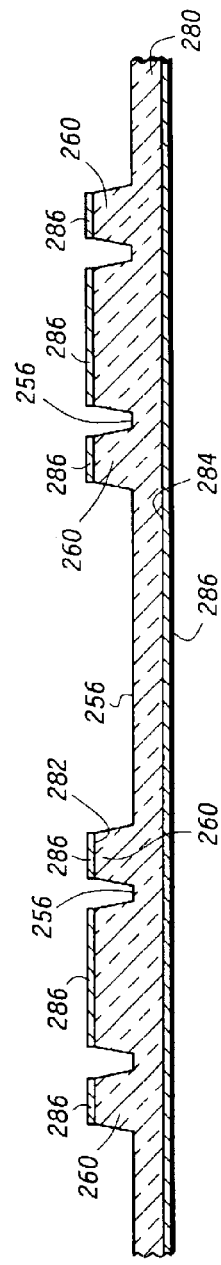

Now, processes for making microdevice 220 as shown in FIGS. 8A–8C will be further explained. Referring to FIG. 9A, a portion of a glass wafer 280 is shown having a first side 282 and a second side 284. The process includes the step of forming at least one recess 256 on the first side 282 of the glass wafer 280. As mentioned above, each recess 256 has a plurality of posts 260. The recess 256 on the first side 282 of the wafer 280 may be formed using known micro-machining methods. In one embodiment, as shown in FIGS. 9A and 9B, a masking material 286 is formed and patterned before the etching of the recesses 256. Then the recesses 256 may be formed using a wet chemical etch in a HF-based solution. Other techniques such as sand blasting and ultrasonic drilling may also be used.

Figure 9C:
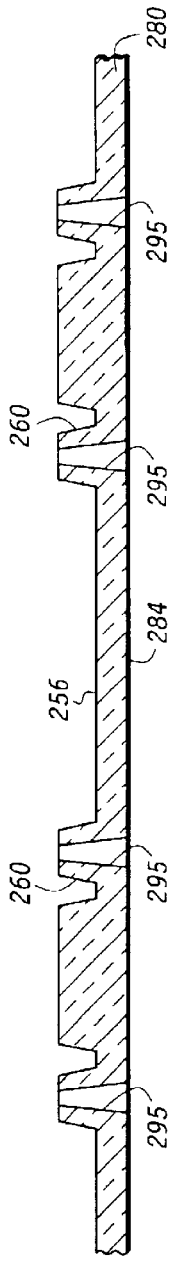

The next step, as shown in FIG. 9C, is to form the through-wafer vias 295 in the glass wafer 280 by using one of available techniques, such as sand blasting, laser drilling, ultrasonic drilling or wet etching.

Figure 9D:
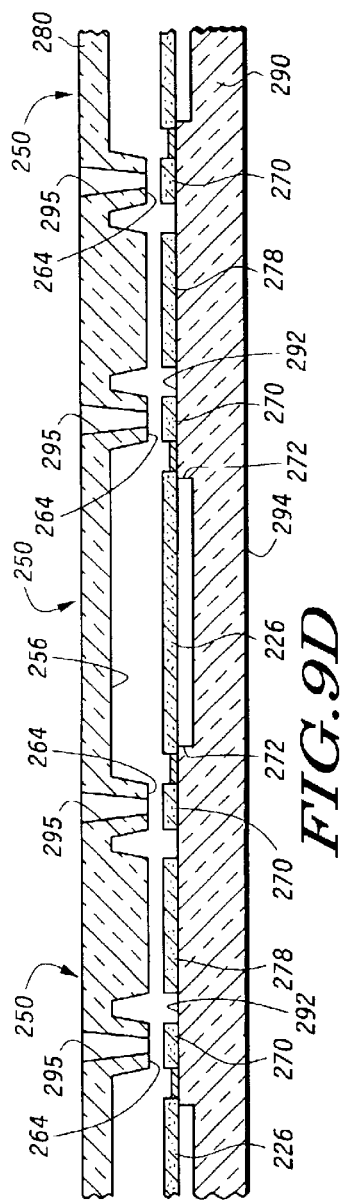

Referring to FIG. 9D, the process may further include assembling the glass wafer 280 (having a plurality of caps 250) with the device substrate wafer 290 (having a plurality of device substrates 230). Each device substrate 230 has a microstructure 226, conductive members 270, metal traces 238, and an outer sealing ring 278 attached thereon. The wafer assembly step should be done in a vacuum environment and under an elevated temperature. This allows for an initial degassing of the materials included in the microdevice.

Figure 9E:
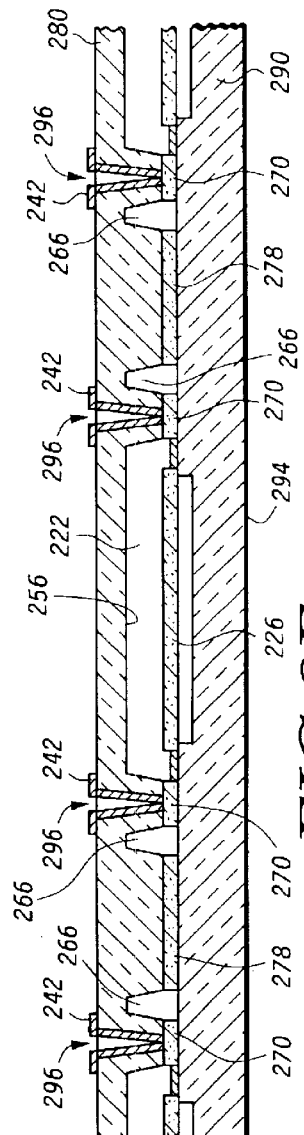

In FIG. 9E, the glass cap wafer 280 may be attached to the glass substrate wafer 290 in a vacuum through the silicon outer sealing rings 278 and conductive members 270 by using the anodic bonding technique as described above. Also shown in FIG. 9E, the through-wafer vias 295 are metalized and patterned to form a conductive via 296 having a conductive cover layer 242.

Figure 9F:
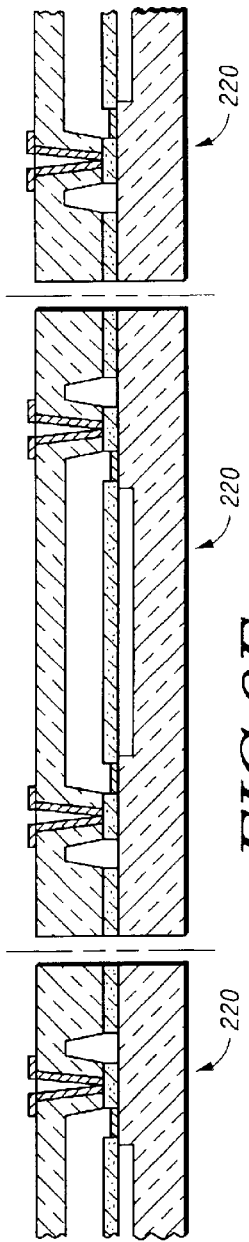

The next step in the process is to dice the wafer assembly into individual microdevices 220 as shown in FIG. 9F.

What has been described is a new microdevice and method of making a microdevice having conductive feedthroughs for electrically connecting a microstructure sealed in a vacuum cavity to the outside environment. The present invention, in one embodiment, provides a better method of sealing a microstructure in wafer level by locating the conductive through-wafer vias outside the cavity. The formation of vias outside of the cavity makes the device more reliable because cracks or other defects in the vias will not disrupt the hermetically sealed cavity. The formation of vias outside of the cavity also greatly reduces the size of the sealed device. The present invention also provides the methods of sealing microstructures in wafer level with conductive through-wafer vias inside the cavity. The use of silicon cap with conductive vias and covers formed on the device substrate, or use of a glass cap with conductive vias formed on the cap and conductive via covers formed on the device substrate enables a reliable hermetic seal. The application teaches how this can be done for vias in the substrate and vias in the cap. The embodiments taught herein have the added benefit of permitting the incorporation of efficient getter layers within the cavity that houses the microstructure. Further, the present invention significantly reduces the cost of making a vacuum-sealed microdevice by using low cost materials and processes. This is especially important to high volume applications.

The above description of the present invention is intended to be exemplary only and is not intended to limit the scope of any patent issuing from this application. The present invention is intended to be limited only by the scope and spirit of the following claims.

What is claimed is:

1. A microdevice having a hermetically sealed cavity to house a microstructure, the micro device comprising:

a substrate having a top side, a bottom side, and an outer edge, the substrate having a plurality of conductive traces formed on at least a portion of its top side and outer edge, the conductive traces providing electrical connection to the microstructure;

a cap having a base portion and a sidewall, the sidewall extending outwardly from the base portion to define a recess in the cap; and an isolation layer attached between at least the sidewall of the cap and the plurality of conductive traces formed on the top side of the substrate, the isolation layer having a gap that defines anchor points and a plurality of contact windows to expose end portions of the conductive traces;

wherein the microstructure is mounted to the anchor points of the isolation layer and adjacent to the gap within the hermetically sealed cavity, the hermetically sealed cavity being at least partially defined by the recess in the cap.

2. The microdevice of claim 1 wherein the cap is made of silicon.

3. The microdevice of claim 2 wherein the silicon cap has a single crystalline silicon getter layer embedded along the recess for maintaining a vacuum within the cavity.

4. The microdevice of claim 3 wherein the embedded single crystalline silicon getter layer is corrugated along at least a bottom surface of the recess of the cap.

5. The microdevice of claim 3 wherein the embedded single crystalline silicon getter layer is activated to adsorb vapor and gas species generated during the sealing process and outgassed from at least the substrate.

6. The microdevice of claim 1 wherein the substrate is made of glass, the conductive traces further formed on the bottom side of the glass substrate to serve as metal pads for connecting the microdevice to a circuit board.

7. The microdevice of claim 1 wherein the isolation layer is made of a glass filler material.

8. The microdevice of claim 1 wherein the microdevice is a gyroscope-sensing element.

9. A method of making a microdevice having a hermetically sealed cavity, the method comprising the steps of:

providing a substrate having a top side and a bottom side;

forming a first set of conductive traces on the top side of the substrate;

forming an isolation layer over at least a portion of the top side of the substrate;

forming a gap in the isolation layer that defines anchor points;

forming a plurality of contact windows in the isolation layer to expose end portions of the first set of conductive traces;

forming a second set of conductive traces on a portion of the isolation layer;

forming a microstructure to the anchor points of the isolation layer and adjacent to the gap;

providing a silicon cap having a first side, a second side, and a recess; and attaching the first side of the silicon cap to the isolation layer formed on the top side of the substrate such that the recess in the silicon cap houses the microstructure and forms the hermetically sealed cavity.

10. The method of claim 9 wherein the method further comprises the steps of:

forming a single crystalline silicon getter layer in the recess of the silicon cap; and activating the getter layer such that the getter layer is capable of adsorbing vapor and gas species generated during the step of attaching the silicon cap to the isolation layer.

11. The method of claim 9 wherein the step of attaching the silicon cap to the isolation layer comprises anodic bonding the silicon cap to the isolation layer.

12. The method of claim 9 wherein the substrate and the isolation layer are made of glass.

13. The method of claim 9 wherein the step of forming an isolation layer over at least the portion of the top side of the substrate further comprises the steps of:

depositing a glass layer on the top side of the substrate; and planarizing and polishing an outer surface of the glass layer.

14. The method of claim 9 wherein the method further comprises the steps of:

forming at least portions of vias in the substrate that extend from the bottom side of the substrate to the top side of the substrate; and forming via covers where the portions of vias extend to the top side of the substrate.

15. The method of claim 14 further comprising the step of metalizing and patterning the formed vias to make the vias conductive and to form metal pads around each via.

16. A microdevice having a hermetically sealed cavity to house a microstructure, the microdevice comprising:

a substrate having a top side and a bottom side, the substrate having a plurality of electrically conductive vias, each via extending from the bottom side and terminating at a contact point at the top side of the substrate;

a cap having a body portion and a sidewall, the sidewall extending outwardly from the body portion to define a recess in the cap, the cap attached to the top side of the substrate; and a plurality of via covers, each via cover attached to the top side of the substrate in a region around the contact point at the top side of the substrate to hermetically seal the via;

wherein the microstructure is mounted within the hermetically sealed cavity, the hermetically sealed cavity being at least partially defined by the recess in the cap.

17. The microdevice of claim 16 wherein the cap is made of silicon.

18. The microdevice of claim 17 wherein the silicon cap has a single crystalline silicon getter layer embedded along the recess for maintaining a vacuum within the cavity.

19. The microdevice of claim 18 wherein the embedded single crystalline silicon getter layer is corrugated along at least a bottom surface of the recess of the cap.

20. The microdevice of claim 18 wherein the embedded single crystalline silicon getter layer is activated to adsorb vapor and gas species generated during the sealing process and outgassed from at least the substrate.

21. The microdevice of claim 16 wherein the via covers are made of silicon and attached to the top surface of the substrate by anodic bonding.

22. The microdevice of claim 16 wherein the via covers are made of an electrically conductive material and provide electrical connection between metal traces on the top side of the substrate and the conductive vias.

23. A method of making a microdevice having a hermetically sealed cavity, the method comprising the steps of:

providing a cap having a first side and a second side, the cap made of silicon;

forming at least one recess in the first side of the cap;

providing a substrate having a top side and a bottom side, the substrate made of an electrically insulating material;

forming a plurality of vias in the substrate that extend from the bottom side and to the top side, each via terminating at the top side of the substrate at separate contact points;

forming a microstructure on the top side of the substrate;

forming a plurality of conductive covers on the top side of the substrate at a region surrounding and covering the contact points; and attaching the first side of the cap to the top side of the substrate such that the recess in the cap houses the microstructure and the conductive covers to form the hermetically sealed cavity.

24. The method of claim 23 wherein the method further includes the steps of:

forming a getter layer in the recess of the cap; and activating the getter layer such that the getter layer is capable of adsorbing vapor and gas species generated during a sealing process and outgassed from at least the substrate.

25. The method of claim 23 wherein the step of forming the microstructure and conductive covers is done after attaching a silicon wafer to the substrate that includes anodic bonding the silicon wafer to the substrate.

26. The method of claim 23 wherein the step of attaching the cap to the substrate includes anodic bonding the cap to the substrate.

27. A microdevice having a hermetically sealed cavity to house a microstructure, the microdevice comprising:

a substrate having a top side and a bottom side, the substrate having a plurality of conductive traces formed on at least a portion of the top side;

a cap attached to the substrate and having a body portion, a sidewall, a plurality of posts, and a plurality of conductive vias, the sidewall extending outwardly from the body portion to define a recess in the cap, the plurality of posts extending outwardly from the body portion within the recess of the cap and in a spaced apart relationship from the sidewall, each conductive via formed within one of the plurality of posts and terminating at an outer end of each post; and a plurality of conductive members, each conductive member attached between at least one of the conductive vias and at least one of the conductive traces;

wherein the microstructure is mounted within the hermetically sealed cavity, the hermetically sealed cavity being at least partially defined by the recess in the cap.

28. The microdevice of claim 27 wherein the cap and substrate are made of glass and the conductive members are made of silicon.

29. The microdevice of claim 27 wherein the microstructure and the conductive members are attached to the top surface of the substrate by anodic bonding.

30. The microdevice of claim 27 further comprising an outer silicon sealing ring attached between the cap and the substrate to provide a hermetic seal.

31. The microdevice of claim 27 wherein the microstructure, conductive members, and outer silicon sealing ring are attached to the substrate and are bonded to the cap by anodic bonding.

32. A method of making a microdevice having a hermetically sealed cavity, the method comprising the steps of:
   providing a cap having a first side and a second side, the cap made of an electrically insulating material;
   forming at least one recess in the first side of the cap, the recess defined by a sidewall that extend outwardly from a base portion of the cap, the recess having a plurality of posts within the recess, the posts in a spaced apart relationship from the sidewall;
   forming a via within each post, the via extending from the second side to the first side of the cap;
   providing a substrate having a top side and a bottom side, the substrate made of an electrically insulating material;
   forming a microstructure on the top side of the substrate;
   forming an outer sealing ring on the top side of the substrate;
   forming a plurality of conductive members on the top side of the substrate; and
   attaching the first side of the cap to the top side of the substrate with the outer sealing ring such that the recess in the cap houses the microstructure and the conductive members in the substrate enclose the vias in the cap, the attachment of the cap to the substrate forming the hermetically sealed cavity.

33. The method of claim 32 further comprising the step of metalizing and patterning the vias to form a conductive layer within each via and a metal pad around each via.

34. The method of claim 32 wherein the method further includes the steps of:
   forming a getter layer in the recess of the cap; and
   activating the getter layer such that the getter layer is capable of adsorbing vapor and gas species generated during a sealing process and outgassed from at least the substrate.

35. The method of claim 32 wherein the step of forming the microstructure, outer sealing ring, and conductive members is done after attaching a silicon wafer to the substrate that includes anodic bonding the silicon wafer to the substrate.

36. The method of claim 32 wherein the outer sealing ring and conductive members are made of silicon, the step of attaching the cap to the substrate include anodic bonding the cap to the substrate by the outer sealing ring and the conductive members.

* * * * *